(12) United States Patent
Sayag

(10) Patent No.: US 7,825,394 B2
(45) Date of Patent: Nov. 2, 2010

(54) LIGHT STIMULATING AND COLLECTING METHODS AND APPARATUS FOR STORAGE-PHOSPHOR IMAGE PLATES

(76) Inventor: Michel Sayag, 1820 Hackett Ave., Mountain View, CA (US) 94043

( * ) Notice: Subject to any disclaimer, the term of this patent is extended or adjusted under 35 U.S.C. 154(b) by 99 days.

(21) Appl. No.: 12/353,169

(22) Filed: Jan. 13, 2009

(65) Prior Publication Data

US 2009/0173899 A1    Jul. 9, 2009

Related U.S. Application Data

(60) Continuation of application No. 11/462,666, filed on Aug. 4, 2006, now abandoned, which is a division of application No. 10/789,547, filed on Feb. 26, 2004, now Pat. No. 7,589,341, which is a division of application No. 09/887,543, filed on Jun. 21, 2001, now Pat. No. 6,800,870.

(60) Provisional application No. 60/257,622, filed on Dec. 20, 2000.

(51) Int. Cl.
*G03B 42/08* (2006.01)
(52) U.S. Cl. .................. 250/584; 250/586; 250/227.23
(58) Field of Classification Search ................ 250/584, 250/586, 227.23
See application file for complete search history.

(56) References Cited

U.S. PATENT DOCUMENTS

| 3,544,713 | A | 12/1970 | Tarzana et al. |
|---|---|---|---|
| 3,859,527 | A | 1/1975 | Luckey |
| 4,236,168 | A | 11/1980 | Herbst |
| 4,258,264 | A | 3/1981 | Kotera et al. |
| 4,302,671 | A | 11/1981 | Kato et al. |
| 4,364,039 | A | 12/1982 | Penz |
| 4,373,167 | A | 2/1983 | Yamada |
| RE31,847 | E | 3/1985 | Luckey |

(Continued)

FOREIGN PATENT DOCUMENTS

DE    19859747    2/2000

(Continued)

OTHER PUBLICATIONS

IEC, "*Cassettes For Medical X-Ray Diagnosis Radiographic Cassettes And Mammographic Cassettes*", CEI/IEC 60406 3rd Ed., 1997.

(Continued)

*Primary Examiner*—David P Porta
*Assistant Examiner*—Shun Lee
(74) *Attorney, Agent, or Firm*—Weaver Austin Villeneuve and Sampson LLP

(57) ABSTRACT

Methods and apparatus are described for retrieving information from a storage medium. A first portion of the surface of the storage medium is exposed to stimulating light which diffuses in the storage medium under a second portion of the surface adjacent the first portion. The second portion of the surface is shielded from exposure to the stimulating light. Stimulated light corresponding to the information is received with at least one detector positioned to receive the stimulated light via the second portion of the surface of the storage medium. The stimulated light is released from the storage medium in response to the stimulating light diffused under the second portion of the surface.

22 Claims, 26 Drawing Sheets

U.S. PATENT DOCUMENTS

| | | | |
|---|---|---|---|
| 4,527,060 | A | 7/1985 | Suzuki et al. |
| 4,679,089 | A | 7/1987 | Kato |
| 4,703,177 | A | 10/1987 | Vieth |
| 4,762,998 | A | 8/1988 | Lubinsky et al. |
| 4,816,679 | A | 3/1989 | Sunagawa et al. |
| 4,827,136 | A | 5/1989 | Bishop et al. |
| 4,880,987 | A | 11/1989 | Hosoi et al. |
| 4,887,139 | A | 12/1989 | Komastu |
| 4,922,103 | A | 5/1990 | Kawajiri et al. |
| 4,933,558 | A | 6/1990 | Carter et al. |
| 4,950,895 | A | 8/1990 | Reinfelder |
| 4,953,038 | A | 8/1990 | Schiebel et al. |
| 4,977,584 | A | 12/1990 | Kohno et al. |
| 4,983,834 | A | 1/1991 | Lindmayer et al. |
| 5,017,782 | A | 5/1991 | Nelson |
| 5,059,795 | A | 10/1991 | Izumi |
| 5,065,866 | A | 11/1991 | Boutet et al. |
| 5,084,619 | A | 1/1992 | Pfeiler et al. |
| 5,208,459 | A | 5/1993 | Morrone et al. |
| 5,266,803 | A | 11/1993 | Heffelfinger |
| 5,268,569 | A | 12/1993 | Nelson et al. |
| 5,299,039 | A | 3/1994 | Bohannon |
| 5,396,081 | A | 3/1995 | Ogura et al. |
| 5,455,428 | A | 10/1995 | Miyagawa |
| 5,483,357 | A | 1/1996 | Nagano |
| 5,528,050 | A | 6/1996 | Miller et al. |
| 5,563,414 | A | 10/1996 | Sklebitz |
| 5,598,008 | A | 1/1997 | Livoni |
| 5,715,292 | A | 2/1998 | Sayag et al. |
| 5,747,825 | A | 5/1998 | Gilblom et al. |
| 5,753,932 | A | 5/1998 | Arakawa |
| 5,796,113 | A | 8/1998 | Nagli et al. |
| 5,864,146 | A | 1/1999 | Karellas |
| 5,898,184 | A | 4/1999 | Stahl et al. |
| 5,939,728 | A | 8/1999 | Wachtel et al. |
| 5,965,897 | A | 10/1999 | Elkind et al. |
| 5,978,026 | A | 11/1999 | Tanigawa et al. |
| 5,981,953 | A | 11/1999 | Schoeters |
| 5,998,802 | A | 12/1999 | Struye et al. |
| 6,140,663 | A | 10/2000 | Neary et al. |
| 6,271,536 | B1 | 8/2001 | Buytaert et al. |
| 6,310,357 | B1 | 10/2001 | Fuchs et al. |

FOREIGN PATENT DOCUMENTS

| | | | |
|---|---|---|---|
| DE | 19922345 | | 11/2000 |
| DE | 19946743 | | 11/2000 |
| DE | 19962775 | | 3/2001 |
| DE | 19946736 | | 5/2001 |
| EP | 0777148 | A1 | 6/1997 |
| EP | 0846962 | A1 | 6/1998 |
| EP | 0862066 | A1 | 9/1998 |
| EP | 0964269 | A2 | 12/1999 |
| EP | 1001276 | A1 | 5/2000 |
| EP | 1014684 | A2 | 6/2000 |
| EP | 1039338 | A2 | 9/2000 |
| EP | 1054268 | | 11/2000 |
| EP | 1063505 | A1 | 12/2000 |
| EP | 1065523 | A2 | 1/2001 |
| EP | 1065524 | A2 | 1/2001 |
| EP | 1065525 | A2 | 1/2001 |
| EP | 1065526 | A2 | 1/2001 |
| EP | 1065527 | A2 | 1/2001 |
| EP | 1065528 | A2 | 1/2001 |
| EP | 1065671 | A1 | 1/2001 |
| EP | 1081507 | A2 | 3/2001 |
| EP | 1096508 | A2 | 5/2001 |
| EP | 1103846 | A1 | 5/2001 |
| EP | 1130417 | A1 | 5/2001 |
| JP | 2-2955 | | 1/2000 |
| JP | 2-10217 | | 1/2000 |
| JP | 2-29153 | | 1/2000 |
| JP | 2-66316 | | 3/2000 |
| JP | 2002-072381 | | 3/2002 |
| WO | WO 99/28765 | | 6/1999 |
| WO | WO 01/48513 | | 5/2001 |

OTHER PUBLICATIONS

M. Thomas, "*The Quantum Efficiency Of Radiographic Imaging With Image Plates*" Apr. 11, 1996, Elsevier Science B.V., pp. 599-611.

M. Thomas, *Image Properties of Polycrystalline Storage Films*, Jul. 1, 1996, Applied Optics vol. 35, No. 19, pp. 3702-3714.

Satoh, et al, "*High-Luminance Florescent Screen With Interference Filter*", SPIE vol. 2432 Jul. 1995, pp. 462-469.

Notice of Allowance dated Dec. 24, 2003 from U.S. Appl. No. 09/887,543.

Office Action dated Jun. 7, 2004 from U.S. Appl. No. 10/789,547.

Office Action dated Nov. 16, 2004 from U.S. Appl. No. 10/789,547.

Office Action dated Jul. 11, 2005 from U.S. Appl. No. 10/789,547.

Office Action dated Feb. 19, 2008 from U.S. Appl. No. 11/462,666.

Final Office Action dated Oct. 7, 2008 from U.S. Appl. No. 11/462,666.

JP Office Action dated of Aug. 7, 2007 from JP Application No. 2002-551570.

European Supplementary Search Report dated May 8, 2008 from EP Application No. 01991354.0-1240.

EP Communication dated Nov. 14, 2008 from EP Application No. 01 991 354.0-1240.

International Preliminary Examination Report dated Aug. 18, 2003 from PCT Application No. PCT/US01/49246.

International Search Report dated Apr. 18, 2002 from International Appliction No. PCT/US01/49246.

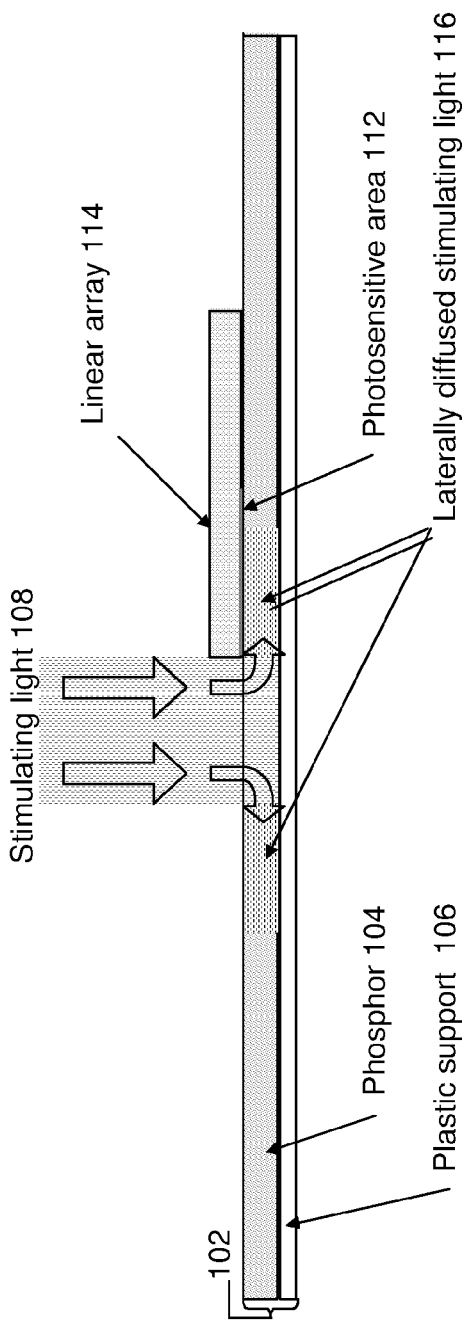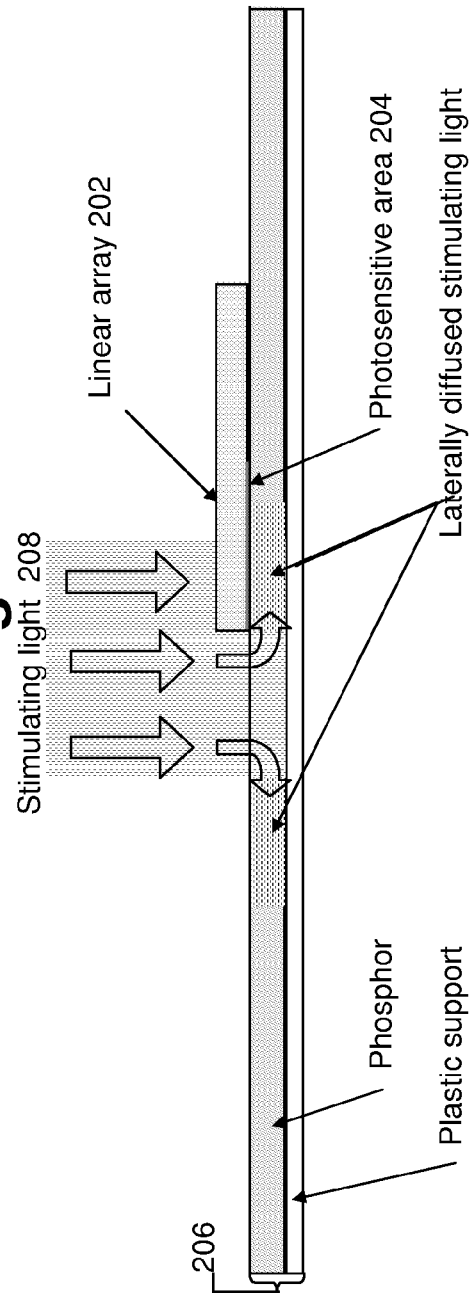

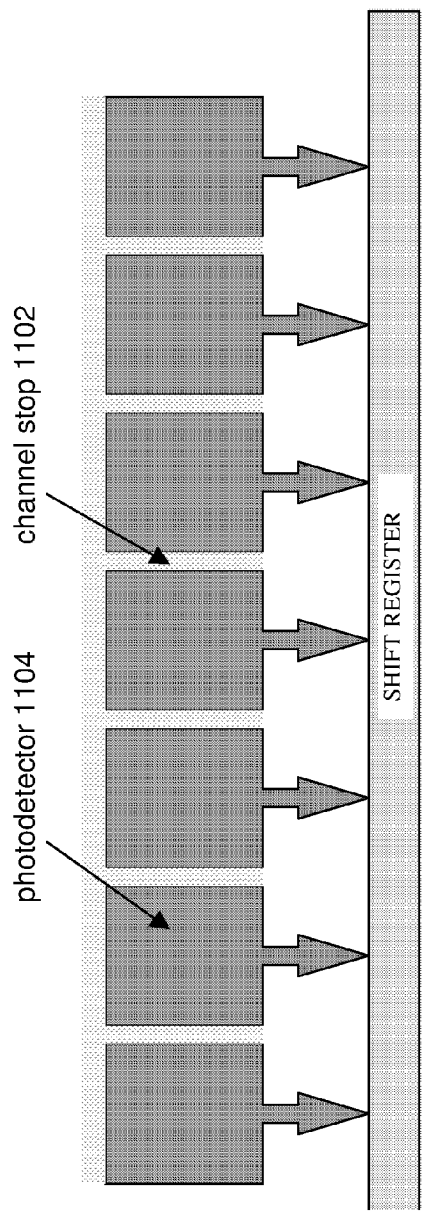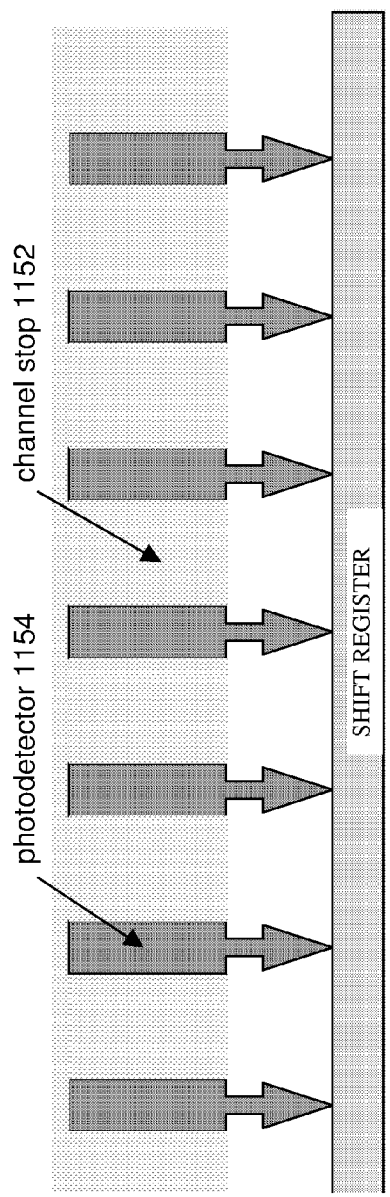
Fig. 11A
Prior art
Fig. 11B
design

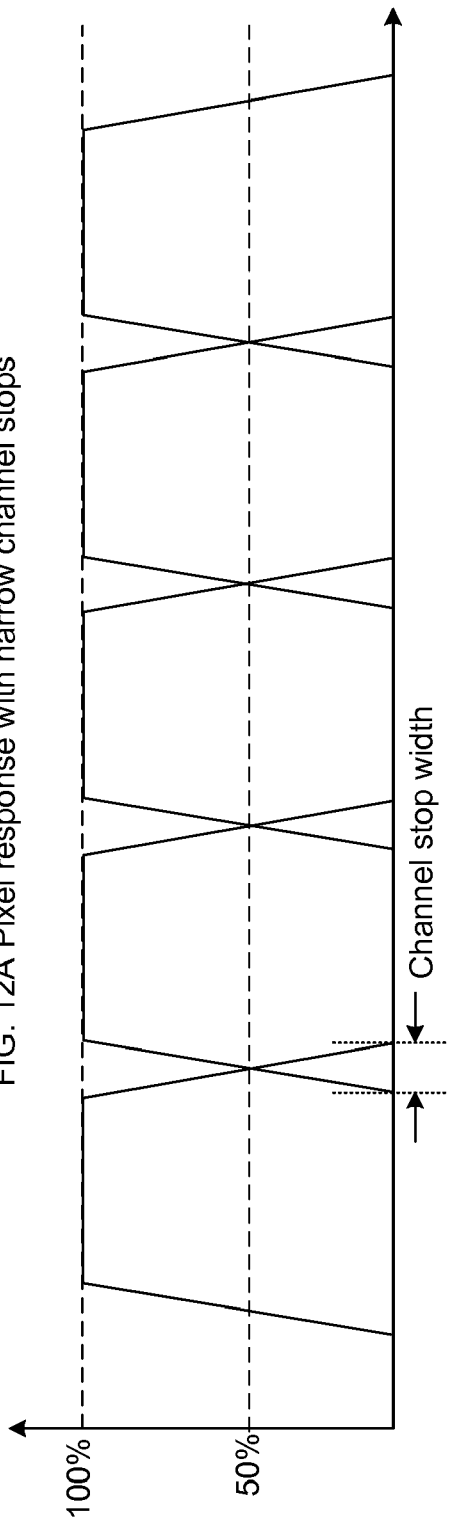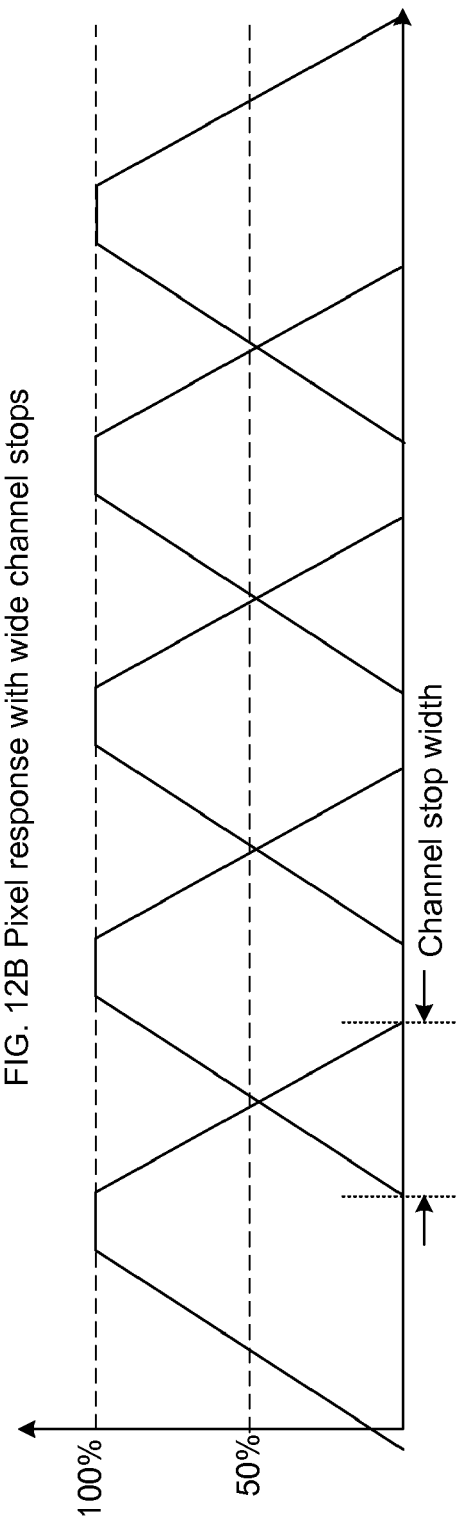

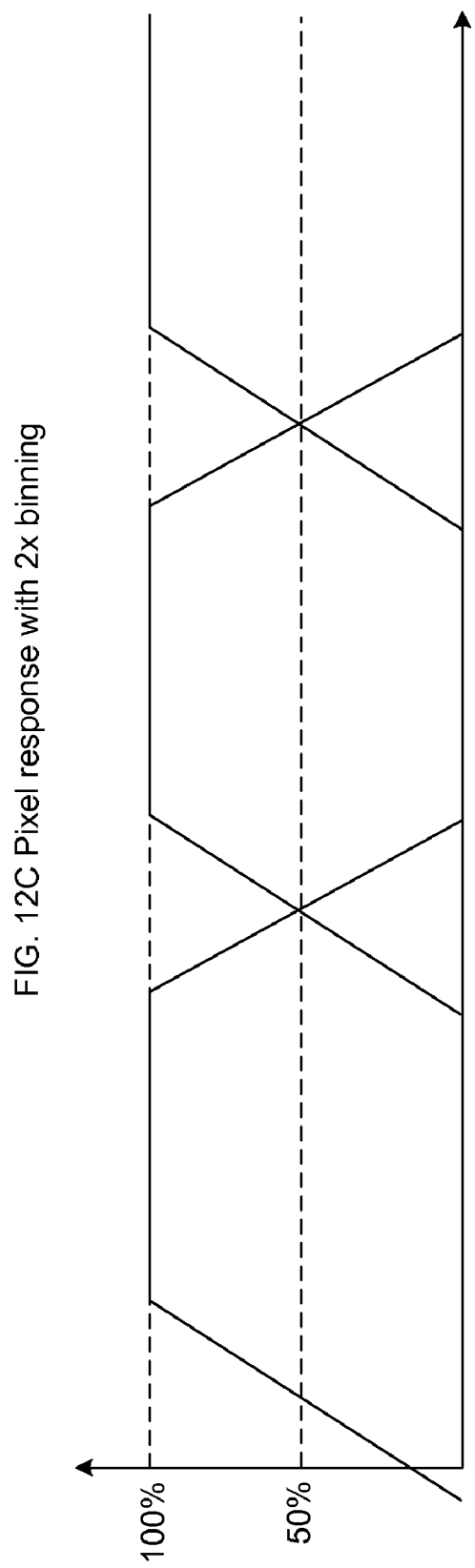
FIG. 12C Pixel response with 2x binning

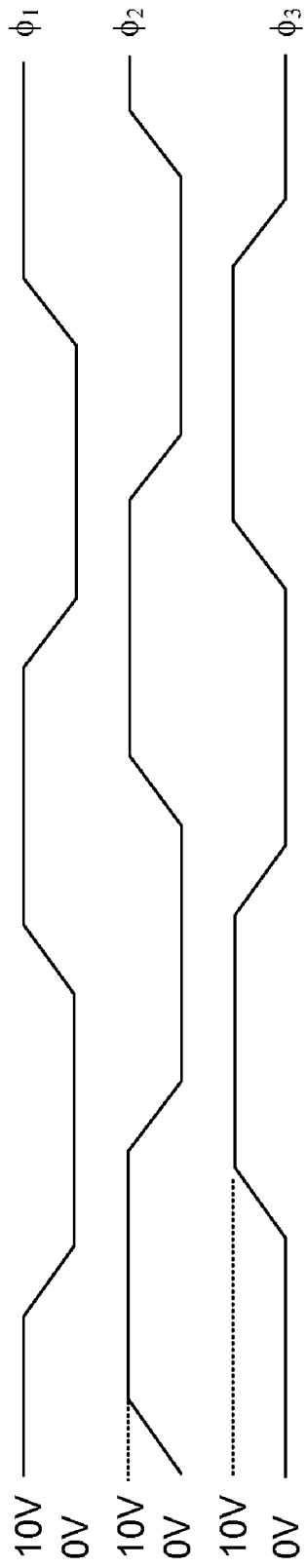
FIG. 14A Non-MPP continuous clocking of a 3-phase linear CCD
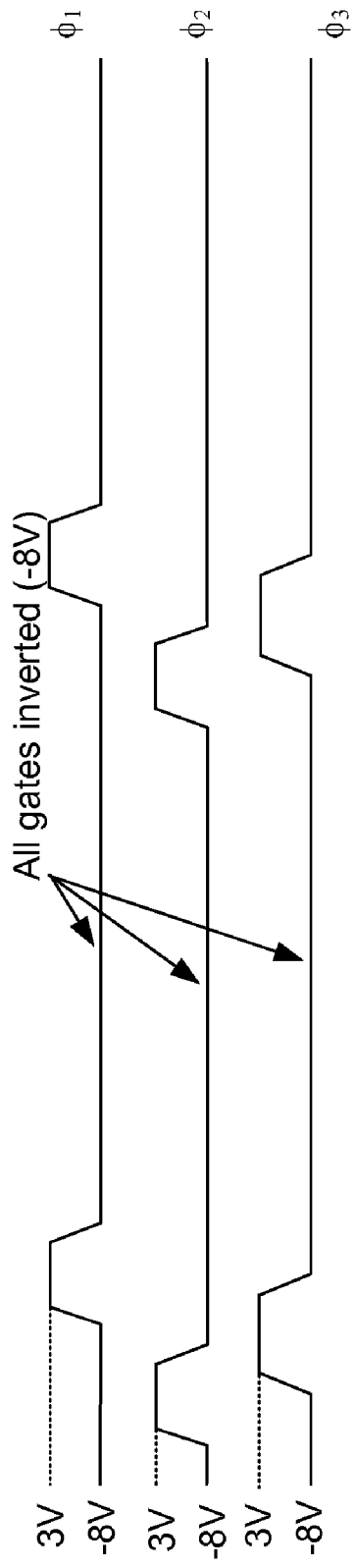
FIG. 14B MMP burst clocking of a 3-phase linear CCD

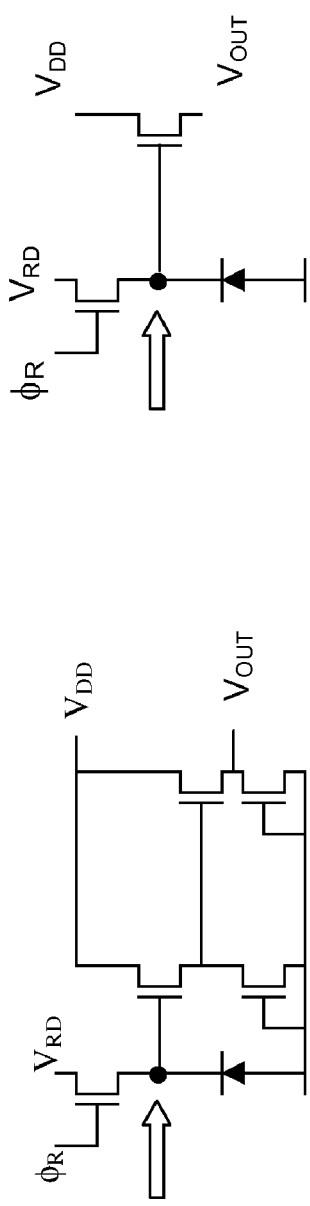

Fig. 18

| Linear CCD specifications for storage-phosphor image plate reading | |
|---|---|
| CCD architecture | Linescan (photosites & single register) |
| Photosite dimension | 220 μm high x 44 μm wide (44 μm pitch) |
| Photosite design | 5 photogates/pixel (44μm high x 4μm wide) |
| Shift register cell dimension | 60 μm x 44 μm on a 44 μm pitch |
| Shift register design | 2poly/2φ or 4φ switchable (with center split) |
| Shift register operation | Uni or bidirectional 2φ or 4φ (MPP mode) |
| Pixel count | 2048 pixels |
| Die size | 90.1 mm x 2.25 mm |
| Total dark current | < 20 pA/cm$^2$ MPP mode at 25°C |
| Shift register dark current (MPP mode) | 25e$^-$/cell for 2ms integration at 40°C |
| Photogate charge transfer inefficiency (lag) | < 50e$^-$ at 1000 e$^-$ signal level |
| Well Capacity | 10$^6$ e$^-$ |
| Amplifier readout noise | 5 e$^-$ at 250 kHz (single-stage amplifier) |
| Output configuration | 1 or 2 outputs in split mode (opposite ends) |
| Effective Quantum Efficiency (uncoated) | > 50% at 400nm (63% QE x 80% FF) |
| Effective Quantum Efficiency (AR coated) | > 75% at 400nm (94% QE x 80% FF) |
| Open photogate fill factor (no poly coverage) | > 80% |
| Maximum readout speed | 500 kHz |
| Binning | 4x |
| Charge Transfer Efficiency | 0.99999 |
| Buttability | 3 side buttable (< 22μm dead space) |

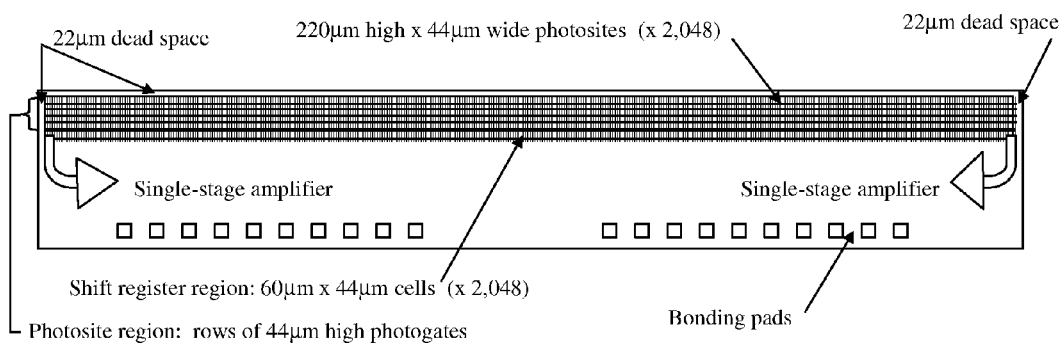

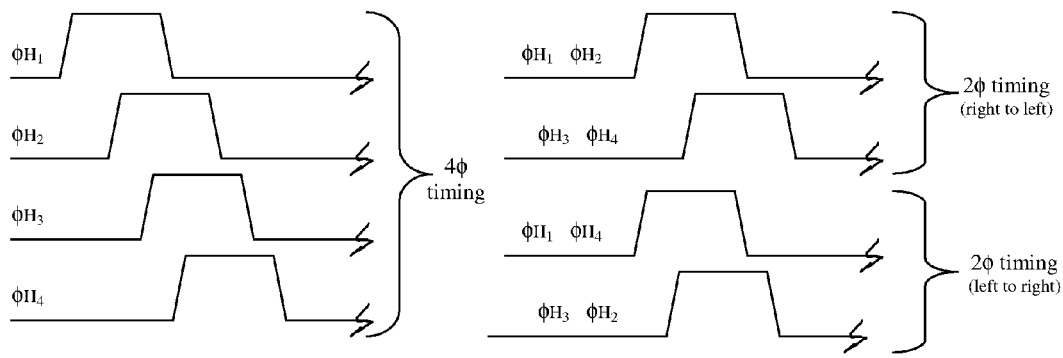

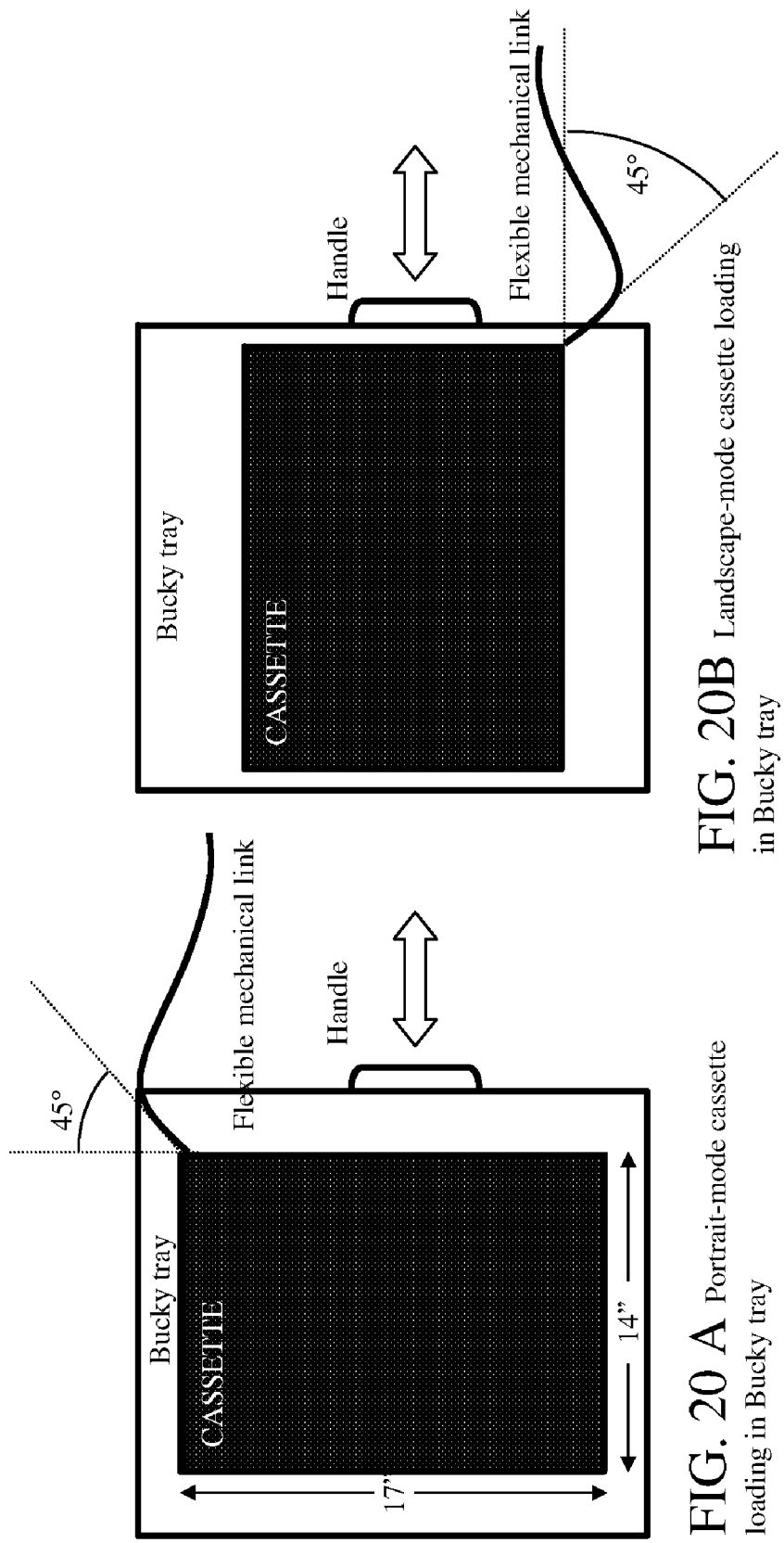
FIG. 20 A Portrait-mode cassette loading in Bucky tray
FIG. 20B Landscape-mode cassette loading in Bucky tray

LIGHT STIMULATING AND COLLECTING METHODS AND APPARATUS FOR STORAGE-PHOSPHOR IMAGE PLATES

RELATED APPLICATION DATA

The present application claims priority from and is a continuation of U.S. patent application Ser. No. 11/462,666 filed Aug. 4, 2006 which is a divisional of U.S. patent application Ser. No. 10/789,547 filed Feb. 26, 2004, which claims priority from U.S. patent application Ser. No. 09/887,543 filed Jun. 21, 2001, now U.S. Pat. No. 6,800,870, which claims priority from U.S. Provisional Application No. 60/257,622 filed Dec. 20, 2000, the entire disclosures of each of which is incorporated herein by reference for all purposes.

BACKGROUND OF THE INVENTION

The present invention relates to the field of digital radiography and more specifically to methods and apparatus for obtaining an electrical representation of a radiation image using a storage-phosphor image plate.

In the field of digital radiography a variety of methods have emerged. One such method is based on capturing the prompt-emitting light of a conventional phosphor screen with an image intensifier, a flat panel detector, or a CCD camera. Another method described in U.S. Pat. No. 3,859,527 (incorporated herein by reference for all purposes) uses a storage-phosphor plate for image detection. After being exposed to x-rays, the storage-phosphor plate is stimulated with an appropriate light source and the image recorded on the plate is read out.

Various methods for reading stored images from storage-phosphor plates have been proposed. A first method relies on a laser scanning mechanism that stimulates one pixel at a time and collects the photo-stimulated light with a photomultiplier. Unfortunately, because only one pixel is read at a time, the readout time for a typical storage-phosphor plate is unacceptably long.

In addition, the laser scanning mechanism necessary to stimulate one pixel at a time on a 14"×17" phosphor plate is very large and complex. The stimulating laser pencil beam must remain well focused on the plate and must scan it from side to side and top to bottom with perfect accuracy. The typical size of a system for reading images from 14"×17" storage-phosphor plates is close to the size of a household refrigerator.

Another problem relates to interplay between the dimension of the stimulating laser pencil beam on the plate (which dictates the spatial resolution of the overall reading apparatus) and the efficiency with which light released from the storage medium is collected. The larger the laser spot on the plate, the lower the resolution. As a result, typical medical storage-phosphor plate readers require the laser spot diameter to be less than 200 microns. The stimulated area of the storage-phosphor plate emits light corresponding to the intensity of the stored image at this particular location. The storage-phosphor material is therefore chosen to have the wavelength of stimulated light different from the wavelength of stimulating light so as to allow for selective collection of the stimulated light and complete rejection of the stimulating light. An optical filter is also typically used to reject the stimulating light and transmit the stimulated light. The optical filter is positioned between the plate and the photomultiplier. Ingenious light collectors have been envisioned to allow for maximum collection of the stimulated light. However, it is very difficult to achieve high collection efficiency since the stimulating light path gets in the way of the stimulated light collection device.

In addition, the stimulated light emits in all directions due to the turbid nature of the storage phosphor plate, which makes it even more difficult to collect. Conventional storage-phosphor plates are made of powder phosphor deposited on a plastic substrate. The phosphor material is granular and white, which makes the powder an almost ideal Lambertian emitter and reflector. The stimulating light from the laser beam is minimally absorbed in the plate, and mostly diffused by the phosphor granules to neighboring granules creating a spread of the laser spot on the plate. This effect results in a reduction of the spatial resolution of the plate reading system, since the region surrounding the laser spot on the plate is also stimulated.

The stimulated light created in the powder phosphor is also diffused in the plate before it reaches the surface where it can be collected. The amount of lateral diffusion of the stimulating light, and of the stimulated light, in the plate is a function of the size of the phosphor granules and the binder material. It is also determined by the thickness of the plate. Several techniques have been proposed to optimize the thickness of the plate and the size of the phosphor granules to achieve maximum performance. Thick phosphor layers are used to maximize the absorption of high energy x-rays at the expense of the spatial resolution. Thinner phosphor layers are used to maximize spatial resolution for lower energy x-ray applications. Additional optimization is achieved by placing a special layer underneath the phosphor layer, which can absorb the stimulating light and reflect the stimulated light back to the front surface. Unfortunately, because of a variety of tradeoffs, none of the previous techniques addressing the spatial resolution issues of storage-phosphor based systems has been universally effective.

For example, attempts have been made to utilize storage plates which are not made of powder phosphor, but rather of single crystal phosphor. These clear plates can potentially achieve higher spatial resolution since no light diffusion occurs in them, but they are very difficult to manufacture and extremely sensitive to scratches and mishandling.

On the other hand, with conventional powder phosphor plates, laser-based scanning systems require complex and sub-optimal tradeoffs between spatial resolution, bleaching ratio (i.e., readout efficiency), and readout speed. The maximum readout time is often dictated by the application (typically less than one minute for medical readers). The required spatial resolution limits the stimulating laser power (too strong of a laser beam creates too large of a spot) and, as a result, only a fraction of the available stimulated light is read out (i.e., partial bleaching). These tradeoffs result in a degradation of image quality (lower Detective Quantum Efficiency, i.e., DQE) since not all the information is read out of the plate. Moreover, additional steps have to be taken to erase the plate (to remove the unread information) before it is reused. Such erasures are typically achieved through intense exposure under bright fluorescent tubes.

Whereas the storage-phosphor plates themselves are ideal replacements to film-screen combinations, currently available laser-based scanning systems are far from ideal. To address at least some of the disadvantages of such systems, attempts have been made to replace the pixel-by-pixel scanning mechanism with a linescan mechanism or a two-dimensional capture device. Various linescan mechanisms have been proposed in which the laser pencil beam is replaced by a laser fan beam and the photomultiplier is replaced by a one-dimensional array of photodetectors. The idea behind such a mechanism, is to read the storage-phosphor plate one line at the time rather than one pixel at a time, thus allowing for a much faster readout time as well as a much simpler and smaller scanning mechanism, i.e., only one-axis mechanical scanning is necessary instead of two-axis scanning.

The theoretical advantages of linescanning over pixel-by-pixel scanning are clear, but the practical implementation of the stimulating fan beam and the associated collecting optics is extremely challenging. Unlike the pixel-by-pixel scanning scheme where the collecting optics are non-imaging, most linescanning schemes require the collecting optics not only to collect as much light as possible, but also image the surface of the plate onto the photodetector line array with suitable resolution. Such techniques also typically require the stimulating light to be confined to an area of the plate smaller than the area imaged onto the photodetector line array in order to guarantee that no stimulated light is lost in the process. These two requirements are very difficult to achieve with conventional techniques as evidenced by the fact that no linescanning plate reader is yet commercially available.

Numerous designs have been proposed, some relying on traditional optics (e.g., U.S. Pat. No. 5,747,825 the entire disclosure of which is incorporated herein by reference), but most assuming that traditional optics are not practical to efficiently image the surface of a plate onto a photodetector line array. In these designs, maximum collection efficiency is achieved by placing the photodetector line array in close proximity to the plate, with no conventional lens in between. Some designs suggest the use of a fiber-optic faceplate between the plate and the photodetector line array presumably to overcome certain mechanical issues related to the array bond wires.

In any case, high collection efficiency and high resolution may be achieved without a traditional lens provided that the linear array is in direct contact with the plate or that the distance between the plate and the linear array is kept to a strict minimum. This constraint creates a serious challenge as far as stimulating the area right underneath the linear array. A small gap can be placed between the plate and the linear array to let the stimulating light pass through, but since the plate has a Lambertian emission, this has a catastrophic effect on the collection efficiency and spatial resolution of the system.

Several solutions have been proposed to solve this issue. One set of solutions, proposed by Hosoi (U.S. Pat. No. 4,880,987 incorporated herein by reference), Leblans (European Patent No. 1014684 incorporated herein by reference) and Schiebel (U.S. Pat. No. 4,953,038 incorporated herein by reference), consists of utilizing a transparent phosphor plate (as opposed to a conventional turbid phosphor plate) and placing the stimulating light source on the side of the plate opposite the linear array. In this configuration, no gap is necessary between the plate and the linear array and maximum light collection efficiency and spatial resolution can be achieved. However, as discussed above, the cost of producing and handling this type of phosphor plate can be prohibitively expensive.

Another solution proposed by Kawajiri (U.S. Pat. No. 4,922,103 incorporated herein by reference) consists of placing the stimulating light source on the side of the linear array opposite the plate. This assumes that the linear array is completely transparent at the wavelength of stimulating light (so as to let the stimulating light pass through the linear array to stimulate the plate), and highly absorbing at the wavelength of the stimulated light (so as to convert the stimulated light into electrical signal). Another solution proposed by Carter (U.S. Pat. No. 4,933,558 incorporated herein by reference) consists of a row of emitting optical fibers which tips are placed at a small angle to the tips of receiving optical fibers, thus allowing the stimulating light to cross path with the stimulated light. This design has the limitations mentioned earlier relating to the gap between the plate and the receiving optical fibers.

Unfortunately, in all these proposed designs, the confinement of the stimulating light to the imaging area is a great engineering challenge. All require precise alignment and registration to ensure that no areas of the plate, other than the imaging area, are exposed. It is therefore desirable to provide techniques for reading images from storage-phosphor plates which maximize the efficiency with which image data are collected without prohibitive expense.

SUMMARY OF THE INVENTION

According to the present invention, methods and apparatus are provided which not only overcome the problems described above, but actually use the main technical obstacles in creating the various solutions described herein. That is, according to various embodiments, instead of attempting to compensate for or inhibit the lateral diffusion of stimulating light in the turbid storage-phosphor medium, this laterally diffused light is actually used to effect indirect stimulation of an adjacent region of the storage-phosphor. The resultant release of stimulated light from that adjacent region is then captured by one or more detectors in direct contact (or close proximity) with surface of the storage-phosphor medium above the indirectly stimulated region.

By controlling the intensity of the stimulating light on one region of a storage-phosphor plate a well-defined diffusion distribution (and therefore stimulation) under an adjacent region can be achieved. Efficient collection of the stimulated light released from this indirectly stimulated region of the storage medium may then be effected by one or more detectors in direct contact with (or at some very small distance from) the surface of the plate.

According to various specific embodiments, a light source, e.g., an array of LEDs, is used to stimulate a region of the plate's surface adjacent a linear array of detectors. The array of detectors is configured to collect stimulated light from an adjacent region of the plate which results from the lateral diffusion of the stimulating light into the region under the array of detectors. The light source and detector array are then scanned across the surface of the plate in one dimension to effect a line-by-line readout. According to a specific embodiment, the scanning of the light source across the plate also effects a sufficiently complete erasure of the stored information.

More generally, the present invention provides methods and apparatus for retrieving information from a storage medium. A first portion of the surface of the storage medium is exposed to stimulating light which diffuses in the storage medium under a second portion of the surface adjacent the first portion. The second portion of the surface is shielded from exposure to the stimulating light. Stimulated light corresponding to the information is received with at least one detector positioned to receive the stimulated light via the second portion of the surface of the storage medium. The stimulated light is released from the storage medium in response to the stimulating light diffused under the second portion of the surface.

According to one embodiment, an x-ray image capture device is provided which includes a storage-phosphor plate operable to capture incident x-rays corresponding to an image. A stimulating light source is operable to expose a first portion of a surface of the storage-phosphor plate to stimulating light such that the stimulating light diffuses in the storage-phosphor plate under a second portion of the surface adjacent the first portion. The second portion of the surface is shielded from exposure to the stimulating light. A linear array of detectors is positioned to receive the stimulated light via the second portion of the surface of the storage-phosphor plate, and convert the stimulated light to electronic data corresponding to the image. The stimulated light is released from the storage-phosphor plate in response to the stimulating light diffused under the second portion of the surface. An actuator assembly is operable to effect relative motion between the surface of the storage-phosphor plate and each of the stimulating light source and the array of detectors in one dimension. According to a more specific embodiment, a cassette enclosure is provided having a form factor corresponding to a standard radiographic film cassette, and having the storage-phosphor plate, the stimulating light source, the array of detectors, and the actuator assembly enclosed therein.

A further understanding of the nature and advantages of the present invention may be realized by reference to the remaining portions of the specification and the drawings.

BRIEF DESCRIPTION OF THE DRAWINGS

FIG. 1 is a simplified diagram of a mechanism for reading information from a turbid storage medium according to a specific embodiment of the present invention;

FIG. 2 is a simplified diagram of a mechanism for reading information from a turbid storage medium according to another specific embodiment of the present invention;

FIGS. 11a and 11b show the architectures of a conventional linear CCD and a linear CCD designed according to a specific embodiment of the present invention, respectively;

FIGS. 12a-12c illustrate the pixel response of a conventional CCD (FIG. 12a) and a CCD designed according to a specific embodiment of the present invention (FIGS. 12b and 12c);

FIGS. 14a and 14b respectively illustrate conventional clocking of a 3-phase linear CCD and MPP burst clocking of a 3-phase linear CCD according to a specific embodiment of the present invention;

FIGS. 15a and 15b respectively show a conventional dual-stage amplifier for a linear CCD and a single-stage amplifier for a linear CCD according to a specific embodiment of the invention;

FIG. 18 is a simplified diagram of a linear CCD architecture according to another specific embodiment of the invention; and FIGS. 19-24 illustrate radiography cassettes designed according to various specific embodiments of the invention.

DETAILED DESCRIPTION OF SPECIFIC EMBODIMENTS

Figure 3:
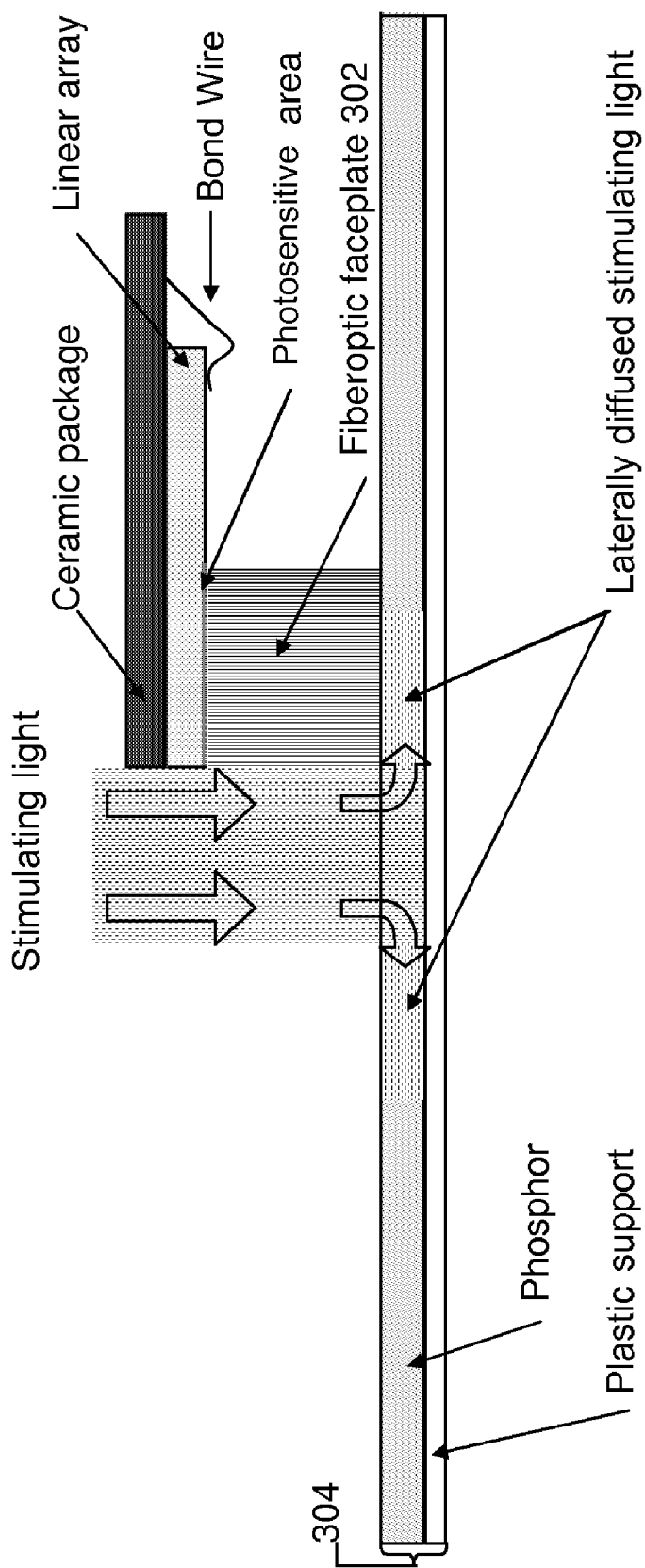
FIG. 3 is a simplified diagram of a mechanism for reading information from a turbid storage medium according to still another specific embodiment of the present invention.

As discussed briefly above, specific embodiments of the present invention provide methods and apparatus for simply and efficiently reading an x-ray image stored in a storage-phosphor plate using a photodetector line array. More specific embodiments of the present invention provide methods and apparatus for reading a storage-phosphor plate in an enclosure of identical dimensions to those of a conventional radiography film/screen cassette. Other embodiments and related applications of the techniques of the present invention are described below.

According to specific embodiments, the present invention provides methods of light stimulating and collecting in storage-phosphor plate readers. Unlike other reading methods where the lateral diffusion of the stimulating light in the plate is a problem, specific embodiments of the present invention rely on such lateral diffusion to stimulate a linear area of the plate which is in direct contact with a photodetector linear array. The stimulating light impinges on an area of the plate adjacent to the area covered by the linear array. The stimulating light penetrates the phosphor and diffuses in all directions, including lateral directions.

Since the phosphor layer is made of a white powder material, the stimulating light is not absorbed but reflected by the white granules and propagates into turbid medium. The light propagation along the surface of the plate is very short since some of the light is absorbed and most of the light is diffused back to the exposed area and towards the top and bottom of the plate. As will be described, some of the techniques described herein allow for a self-aligned illumination which is not only perfectly registered with the linear array, but also well-defined in terms of its width.

Whereas other methods require a very narrow illumination slit difficult to generate in a turbid material, some embodiments of the present invention rely on a knife-edge illumination which is easy to generate and which allows stimulation of a well defined and controlled region beyond the exposed area. The bleeding of stimulating light beyond the exposed area is in fact equivalent to a very narrow illumination slit. However, the width of the stimulating slit is not defined by complex collimating optics, but rather by the attenuation coefficient of light inherent in the phosphor material. It is therefore possible to generate the equivalent of a very narrow illuminating slit which will stimulate a linear area of the phosphor material from within. According to various embodiments, the fact that the stimulation area is not a narrow slit confined within the collecting/imaging area (as described in other patents), but rather a wide rectangular area sharply defined on one side only by a photodetector linear array, also provides a solution to another problem. As will be described, the additional exposure to stimulating light in some embodiments of the invention also provides for the erasure of any residual information in the plate before it is reused.

That is, even though the stimulating light intensity and the scanning speed are typically set so as to fully read out the plate underneath the linear array, the bleaching process may not be 100% complete. Thus, the additional exposure provided by the direct stimulating light is useful to fully erase the plate before it is reused. This stimulation method allows for the readout and erasing of the plate to occur simultaneously with a single scan. This is a significant improvement compared to conventional methods where the erasing of the plate occurs after the readout has been completed, thus increasing the total cycle time of the system.

In most existing equipment, the plate is read out using a laser scanning mechanism and is then transported for exposure to a bank of incandescent or fluorescent high-power lamps for erasing. In addition to the obvious disadvantage of these extra processing steps, such lamps use a lot of power, generate a lot of heat, and require a large enclosure. According to further embodiments of the invention, if additional erasing of the plate is necessary or desired, the stimulating light source can be energized while the array is scanned in the direction opposite to the readout direction.

As mentioned above, the turbid nature of storage-phosphor media presents a significant problem for previous techniques which relates to confinement of the stimulating light to a precise area of the plate. That is, the stimulating light tends to diffuse laterally inside the turbid phosphor layer, thus undesirably increasing the area of stimulation. This lateral diffusion effect, which is a problem in previous designs, is actually a phenomenon on which the present invention relies for efficacy. According to a specific embodiment of the invention and as shown in FIG. 1, the surface of a storage-phosphor plate 102 (comprising a storage-phosphor layer 104 on a plastic substrate 106) is exposed to stimulating light 108 (e.g., red light) in a region adjacent the imaging area (i.e., the area under photosensitive area 112 of detector 114) rather than in the imaging area itself. According to various embodiments, stimulating light 108 may be delivered in the form of a single LED or a laser pencil beam (e.g., for a pixel-by-pixel readout), or an array of LEDs or a laser fan beam (e.g., for a line-by-line readout). According to a specific embodiment, the region directly exposed to stimulating light 108 and the imaging area are adjacent linear regions on the surface of plate 102 and detector 114 comprises a linear array of photodetectors.

According to specific embodiments and as shown in FIG. 1, the linear array of photodetectors may be in contact or very close proximity with the plate with the stimulating light source exposing the area of the plate adjacent to photodetectors. The linear array of photodetectors and the stimulating light source are transported simultaneously across the plate with the linear array of photodetectors leading and the stimulating light source trailing. The area of the plate under the linear array of photodetectors is read because of the diffused stimulating light, and then, according to specific embodiments, is fully erased by the trailing stimulating light.

The approach of the present invention runs counter to previous techniques which generally try to avoid stimulating an area outside the imaging area for fear of not collecting all the stimulated light and losing information. However, according to the invention, by stimulating plate 102 in an area adjacent the imaging area, the imaging area becomes indirectly stimulated by light 116 laterally diffused within the plate rather than by direct exposure to stimulating light 108. Thus, reliance on the lateral diffusion of stimulating light within the plate allows stimulation of an area of the plate from the side rather than from the bottom or from the top. This, in turn, allows elimination (or minimization) of any gap between the plate and detector 114 which would otherwise be necessary for the stimulating light to impinge on the plate in the same area as the imaging area. Indirect stimulation of a desired region of the plate in this manner allows for the detector(s) to be placed in direct contact with (or in very close proximity to) the imaging region, thus resulting in high collection efficiency as well as high spatial resolution.

Unlike a previously mentioned design where a strip of a plate is stimulated from one side of the plate and imaged from the other, this design does not require a special transparent plate. Rather, it can be implemented using conventional turbid storage-phosphor plates. This is a significant benefit in that transparent plates are expensive and very difficult to manufacture whereas conventional plates are easy to manufacture and readily available. Another benefit of the design of the present invention is that the stimulating hardware and collecting hardware may be disposed on the same side of the plate. According to such embodiments, the overall profile of the hardware can be made very low. According to one such embodiment (described below), the hardware is configured so as to fit into an enclosure with dimensions substantially similar to those of a standard film cassette. As will be understood, such an embodiment would be problematic (and likely impracticable) using stimulating hardware and collecting hardware on opposite sides of the plate.

Yet another benefit associated with placement of the stimulating hardware and collecting hardware on the same side of the storage-phosphor plate relates to the alignment and registration of the stimulating hardware with the collecting hardware. According to a specific embodiment which will be described with reference to FIG. 2, a self-aligned assembly of the stimulating and collecting hardware is provided.

FIG. 2 shows a self-aligned arrangement for the stimulating light. That is, the linear array of photodetectors blocks the stimulating light from the plate. The edge of the linear array defines the boundary between the area of the plate directly exposed to the stimulating light and the area of the plate indirectly exposed to stimulating light through diffusion. More specifically, a linear array 202 has a photosensitive area 204 which extends to the edge of its substrate. The area of plate 206 adjacent that edge is exposed to stimulating light 208 to achieve a perfectly aligned and well-controlled stimulation area under linear array 202. That is, even though the width of stimulating light 208 is not confined to the area to the left of linear array 202, linear array 202 acts as a knife edge for stimulating light 208, forming a self-aligned mask which allows surface exposure only to a linear region adjacent photosensitive area 204 of array 202.

The width of the stimulated area under photosensitive area 204 relates to the intensity of stimulating light 208 in the exposed region of the plate as well as the attenuation coefficient in the plate itself. For example, in some media the intensity of the laterally diffused stimulating light decreases exponentially moving away from the edge of an exposed region in a well defined manner. Thus, depending on the characteristics of specific media and the desired resolution, the stimulating light intensity and/or the linear array photosite may be varied in accordance with particular applications of the present invention. A significant advantage associated with the self-aligned nature of such an embodiment of the invention is the fact that careful focusing of the stimulating light using, for example, a laser fan beam, is not necessary. In fact, the applied light can be relatively diffuse as delivered, for example, with an inexpensive array of LEDs.

FIGS. 1 and 2 illustrate some of the basic principles of the present invention. However, it will be understood that in some cases it will not be practical to position a linear array of photodetectors in contact with a phosphor plate. That is, the photosensitive side of the linear array often includes the bonding area for the interconnecting wires. These wires typically protrude above the photosensitive surface and prevent any other surface from being placed against it. These wires are also very small and fragile and must be protected from any direct contact with a moving surface. The photosensitive surface of the linear array itself is also fragile and needs to be protected from direct contact with a moving surface. One method for protecting both the wire bonds and the photosensitive surface involves the use of a fiber-optic faceplate between the photosensitive surface of the linear array and the phosphor plate. In such an implementation, the fiber-optic faceplate may be permanently bonded to the photosensitive side of the linear array, thus clearing the wire bonds from the phosphor plate. FIG. 3 illustrates such an specific embodiment in which collection of stimulated light in response to laterally diffused stimulating light is effected through a fiber-optic face plate 302. It should be noted that the gap between the surface of storage medium 304 and fiber-optic face plate 302 has been exaggerated for illustrative purposes.

Figure 4:
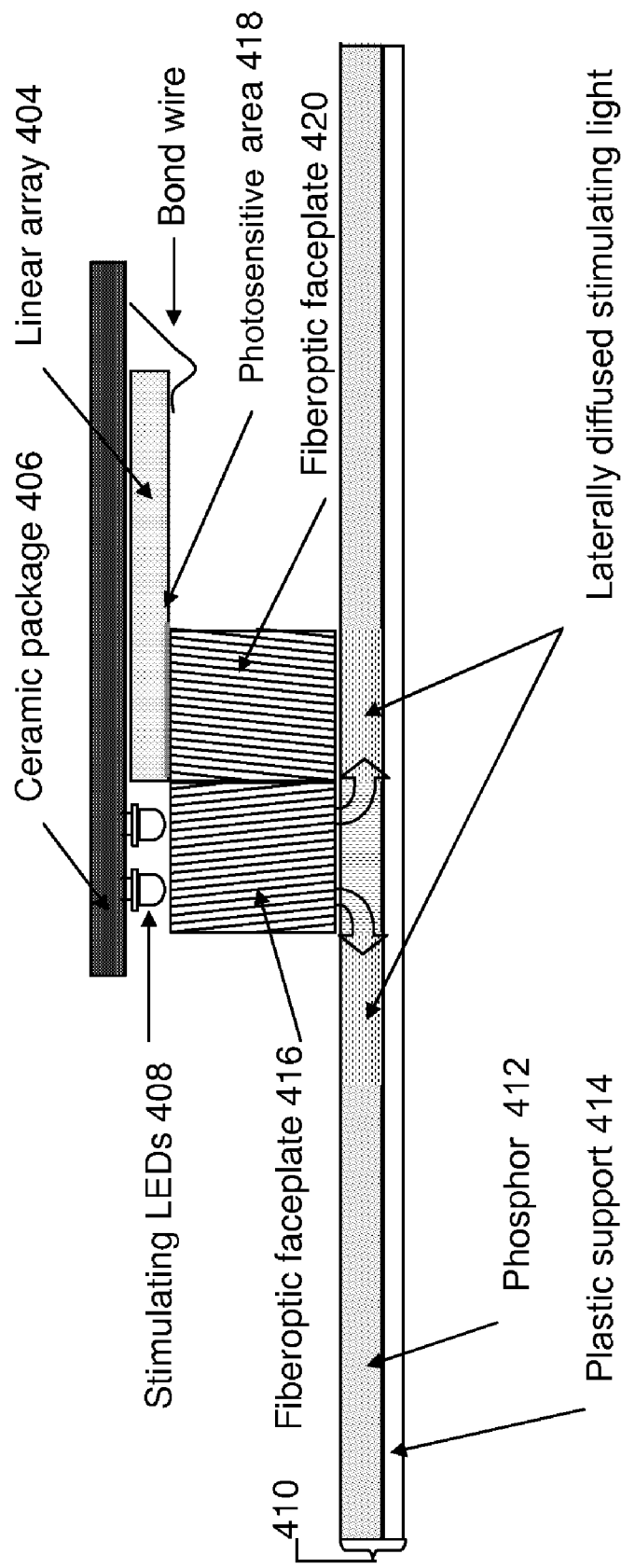
FIG. 4 is a simplified diagram of a mechanism for reading information from a turbid storage medium according to yet another specific embodiment of the present invention.

FIG. 4 shows a further refinement of the arrangement shown in FIG. 3. In FIG. 3, the edge of the fiber-optic faceplate creates the boundary between the directly exposed area of the plate and the indirectly exposed area of the plate. The sharpness of this edge is important to the uniformity of the diffused light profile under the detector array. By placing two fiber-optic faceplates against each other (one for illumination with stimulating light, one for collection of stimulated light) it is possible to protect the edge of the collecting faceplate against chipping and cracking of the edge of the collecting faceplate. According to this embodiment, a single apparatus is provided to effect both the stimulating and collecting functions. As will be understood, this configuration facilitates simultaneous scanning of the stimulating and collecting apparatus as well as provides a low profile for packaging of the readout apparatus with the storage medium in, for example, a standard radiography cassette.

In the embodiment shown, the linear array of detectors 404 are combined in ceramic package 406 with a two dimensional array of LEDs 408 which provide the stimulating light to storage-phosphor plate 410 which comprises a storage phosphor layer 412 on a plastic substrate 414. The stimulating light from LEDs 408 is transmitted to the surface of the phosphor 412 via a first fiber-optic faceplate 416. Alternatively, faceplate 416 may comprise a block of uniform material such as glass or plastic as transmission of the stimulating light to the surface of phosphor 412 via fibers is not critical to the operation of the invention.

As described above with reference to various other embodiments of the invention, the stimulating light diffuses in phosphor 412 into the region below the photosensitive regions 418 of detectors 404. This indirect stimulation of this region of phosphor 412 results in the release of previously stored information as stimulated light which is then captured by detectors 404 via a second fiber-optic faceplate 420.

Not shown in the figures to which the foregoing description refers is some means for inhibiting or absorbing the stimulating light diffused back by the plate towards the linear array of photodetectors. As with conventional laser scanning methods, such filtering is important to proper system operation. That is, since the stimulated light is much dimmer than the stimulating light and is the only light containing image information, it is important to prevent stimulating light from reaching the photodetectors. Various techniques for blocking the stimulating light will be described below.

Referring back to FIG. 4, because the source of the stimulating light and the means by which the subsequently released energy is captured are disposed in the same package, alignment of these two elements is consistent and reliable. In addition, the simultaneous and coordinated scanning of the arrays of LEDs and detectors across the surface of the storage-phosphor plate (as illustrated in FIG. 5) can be managed with a single mechanism such as, for example, a precision stepper motor.

Figure 5:
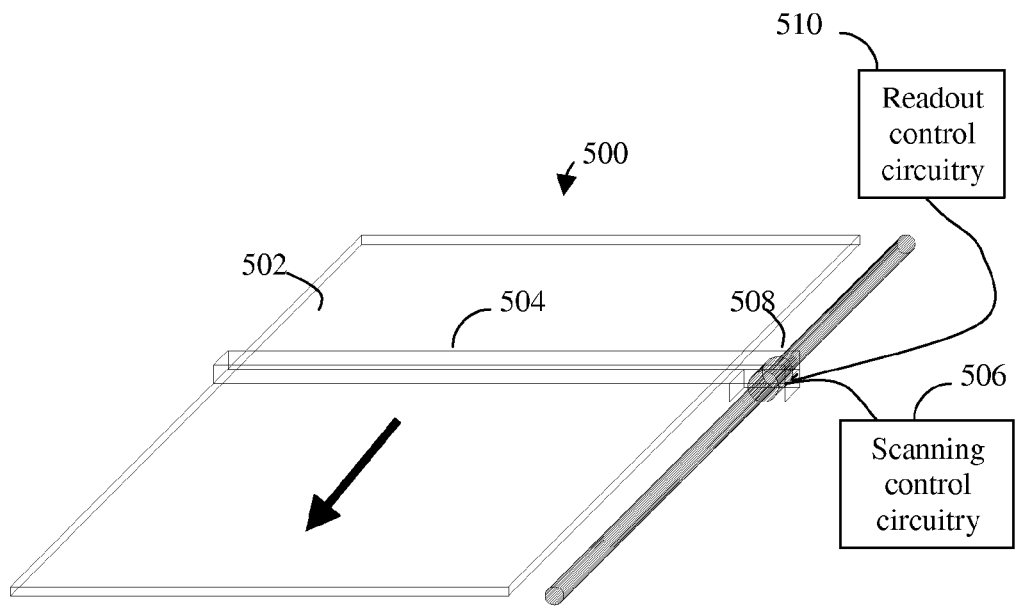
FIG. 5 is a simplified diagram of a line-scanning apparatus for use with various embodiments of the present invention.

FIG. 5 shows a system 500 for capturing and reading out image data for use with, for example, radiography systems. Once an image is captured in storage medium 502 (e.g., a storage-phosphor plate), the release and capture of the stored information may be effected by scanning a linear readout apparatus 504 designed according to the present invention across the surface of storage medium 502. According to various embodiments, readout apparatus may comprise a single apparatus such as that described above with reference to FIG. 4 in which both the source of stimulating light and the detector array are included. Alternatively, apparatus 504 may comprise two separate apparatus the operation and scanning of which are closely coordinated to effect readout in the manner described herein.

That is, regardless of the specific mechanical nature of apparatus 504, readout of information in storage medium 502 is effected by indirect stimulation of the region of interest according to the techniques described above. Movement of apparatus 504 may be controlled via scanning control 506 which generates signals to control a mechanical actuator 508 which may include, for example, a precision stepper motor. As will be understood, any of a variety of techniques may be employed to effect the precise, e.g., line-by-line, scanning of readout apparatus 504 over storage medium 502.

Stimulated light is released from storage medium 502 and captured by the detectors of readout apparatus 504 as controlled by readout control 510 according to any of a variety of well know techniques which convert captured radiation to electrical or optical data which may then be stored for later retrieval. It will be understood that scanning control and readout control via 506 and 510 may effected in a variety of ways without departing from the scope of the present invention. For example, such control may be effected using microprocessor controlled circuitry, application specific integrated circuits, or software.

Figure 6:
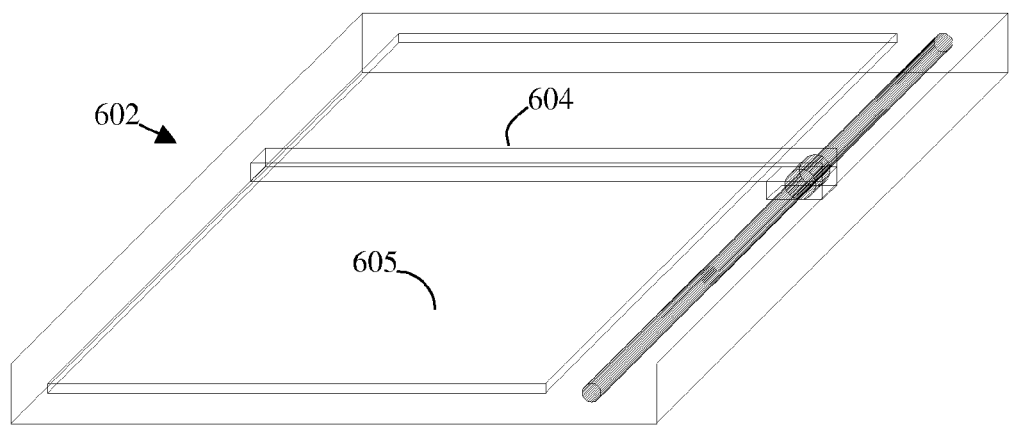
FIG. 6 is a simplified diagram of a radiography cassette for use with various embodiments of the present invention.

FIG. 6 illustrates yet another specific embodiment of the present invention in which a readout apparatus and storage medium combination such as that described above with reference to FIG. 5 may be integrated in a cassette 602 which may be a standard size for a particular application, e.g., a radiography cassette. Control of the readout mechanism 604 and readout of data from storage medium 605 could be effected via connector (not shown) which may comprise any of a variety of commercially available parallel or serial connectors. Alternatively, readout of data could be effected via one or more conductors exiting cassette 602.

In the radiography context, such a device could be conveniently used with the existing installed base of radiography systems. That is, the standard size cassettes could be inserted into an existing radiography table for capture of x-ray images in the same manner as the standard film cassettes. The image data may then be read through suitable connections, e.g., a connector or bundle of conductors, while the cassette conveniently remains installed in the radiography table, i.e., in-situ readout. Alternatively, the cassette may be removed and connected to a reader (which may be a conventional PC or work station). Readout (and simultaneous erasure) of the stored information is then effected in the manner described above, after which the cassette is ready for subsequent image capture.

According to various embodiments, the present invention includes implementations integrated into any standard size radiography cassettes as defined by international standard IEC 60406, the entire disclosure of which is incorporated herein by reference for all purposes. Specific examples of cassette dimensions include, but are not limited to, 14"×17", 14"×14", 10"×12", 8"×10", 35 cm×43 cm, 35 cm×35 cm, 20 cm×40 cm, 18 cm×43 cm, 13 cm×18 cm, 13 cm×30 cm, 18 cm×24 cm, and 24 cm×30 cm.

Given the state of the art of the capture and processing of image data, a line-by-line scanning of a standard 14"×17" image could be effected using the techniques of the present invention in roughly 10 seconds which compares favorably to the several minutes required for development of conventional film. In addition, the image is electronically stored and can be permanently archived for later retrieval without having to physically store the large developed image.

It should be noted that nature of the apparatus integrated in a cassette such as cassette 602 may vary without departing from the scope of the present invention. For example and as described above, the readout apparatus and mechanical scanning mechanism can take a variety of forms. In addition, various parts of the scanning and readout control may be integrated with cassette 602. For example, one or more microprocessors and associated control circuitry may be included in cassette 602 to effect scanning and image capture as instructed by control signals from an external computer. Scanning and image capture could even be effected entirely within the cassette which could include sufficient onboard memory for temporarily storing the image until it can be downloaded for viewing and archiving.

Alternatively, generation of control signals for scanning and image capture may be effected entirely outside of the cassette with data being transmitted back and forth via, for example, a connector. In any event, the present invention contemplates and encompasses any of a variety of combinations of on and off board control of the scanning and data capture functions.

As should be well understood at this point, the fundamental principle of the present invention is the stimulation of an area of a storage plate through lateral diffusion of the stimulating light within the plate. To improve the performance of systems based on this fundamental principle, a number of optimizations may be made for each of the components of such a system. As will become clear, some of these optimizations are independent of this fundamental principle, and as such constitute independent inventions. Various components of such systems are discussed herein and include storage plates, fiber-optic faceplates, sources of stimulating light, linear arrays of photodetectors, filters for blocking stimulating light, scanning mechanisms and system housings.

Storage Plates

Since the methods of stimulation and collection described herein are different than conventional laser scanning techniques, the physical parameters of the storage plate employed for the present invention may be correspondingly different. That is, the thickness of the plate, the grain size of the phosphor, the amount of binder, and the amount of dye may be altered from that which is appropriate for conventional techniques for improved performance of the techniques of the present invention.

Exceeding a certain level of concentration of energy-absorbing dye in plates read by conventional laser scanning techniques can be problematic since high concentrations of such dye would tend to prevent the entire thickness of the plate from being stimulated. By contrast, according to the various techniques of the present invention, plates with very high concentrations of energy-absorbing dye may be employed to achieve particular absorption and stimulation characteristics because the intensity of the stimulating light may simply be increased correspondingly without the negative effects suffered by conventional techniques.

Figure 7A:
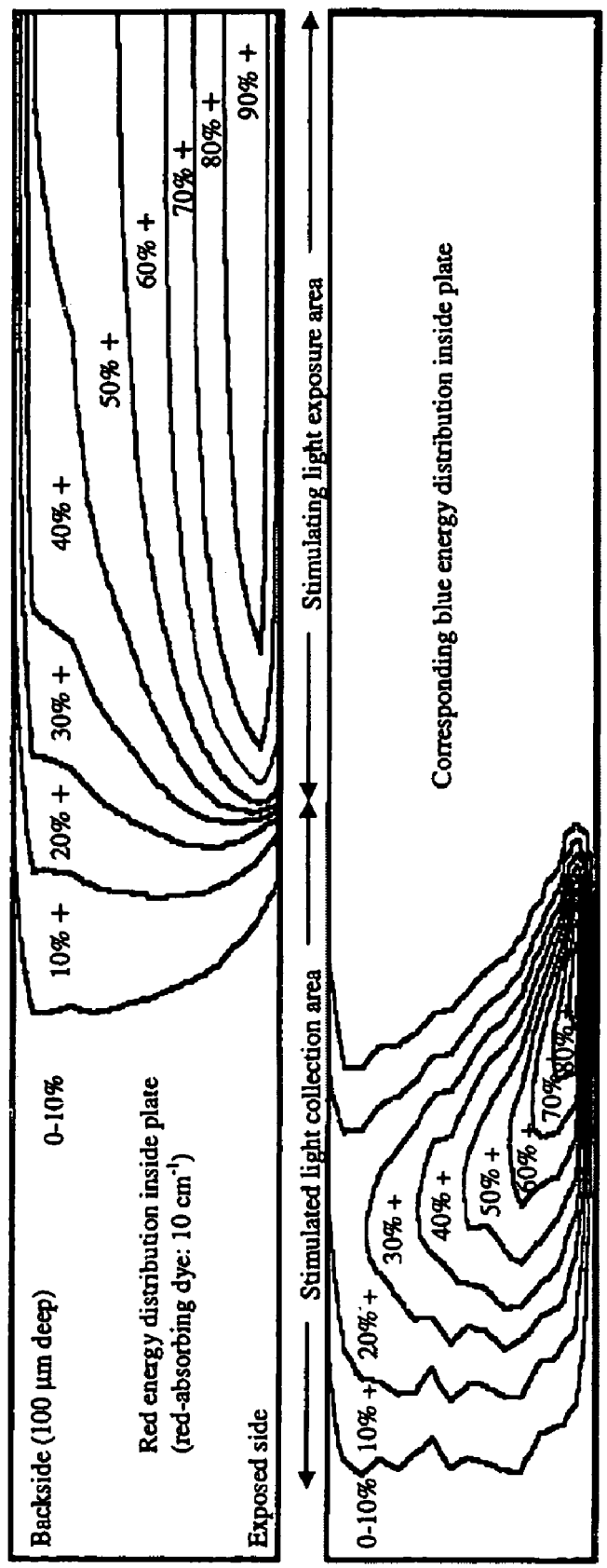
FIGS. 7a-7c show the absorption profile of stimulating light and the point spread function of the resulting stimulated light for different concentrations of energy-absorbing dye in the plate according to various embodiments of the invention.
Figure 7B:
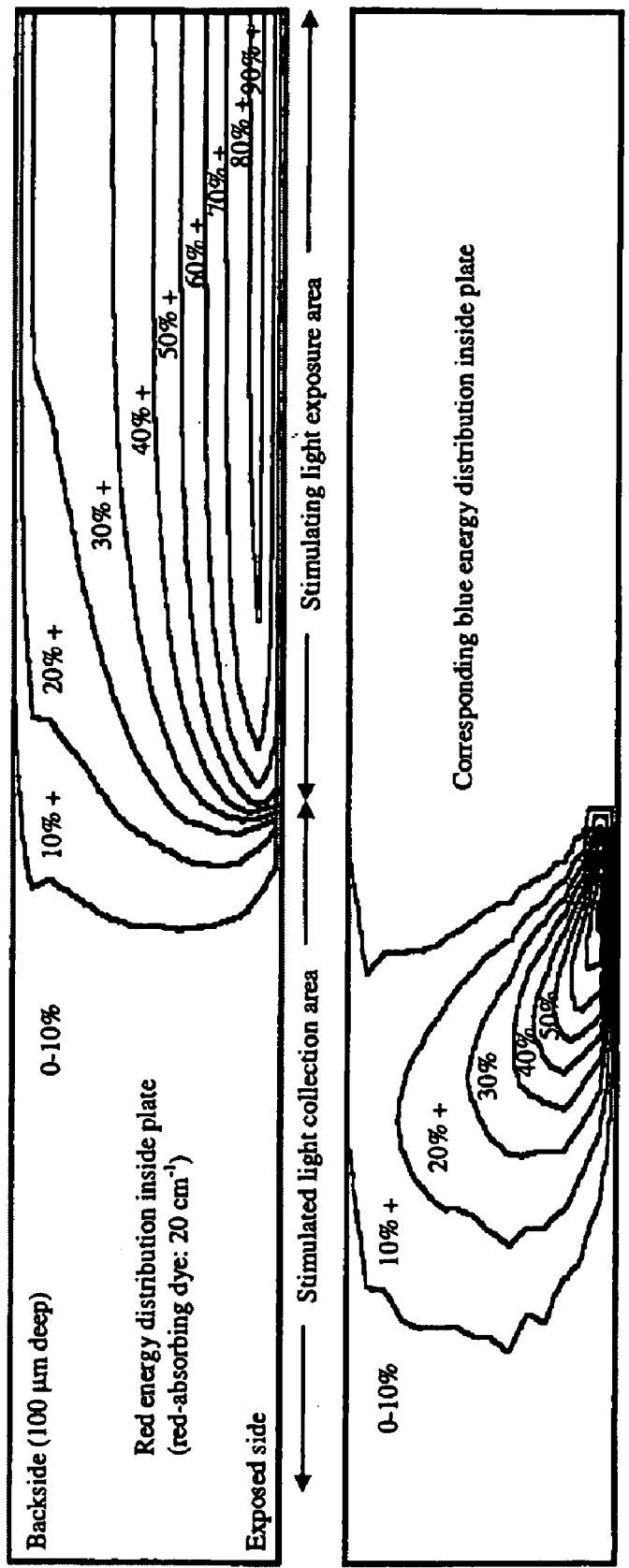
Figure 7C:
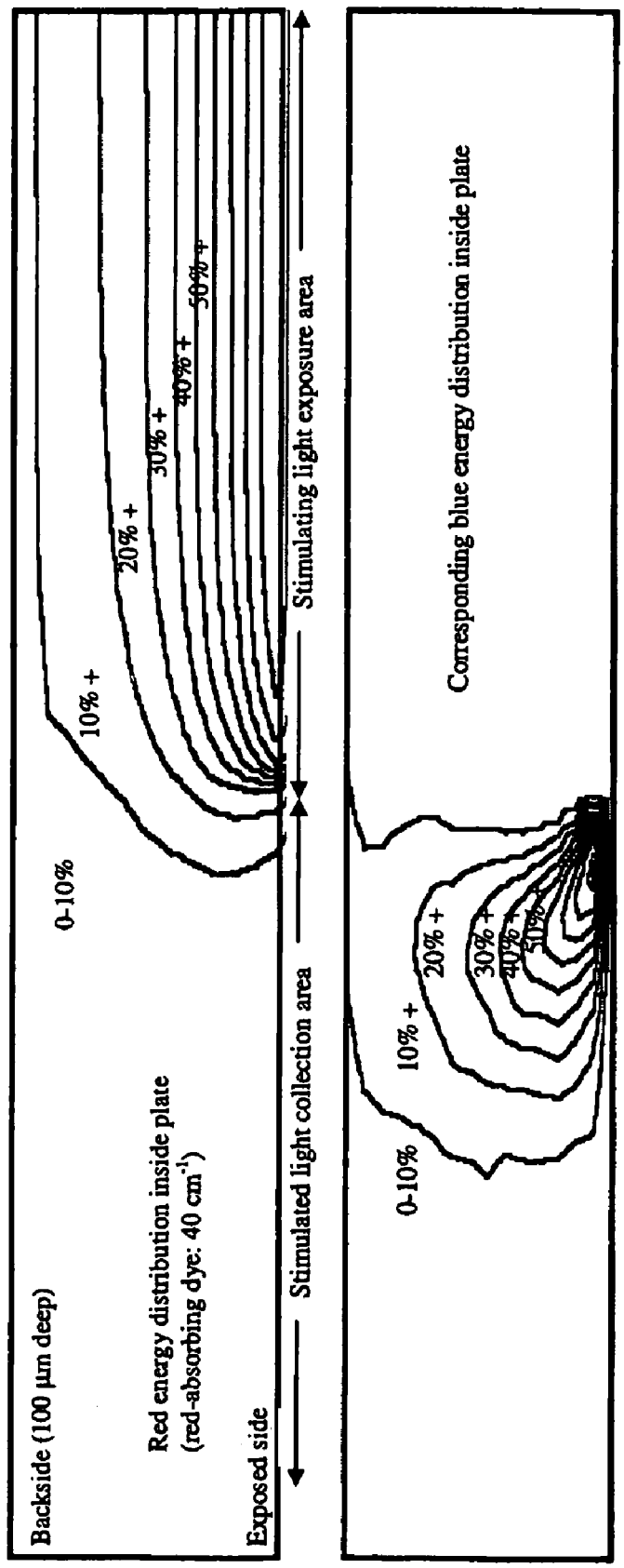

For example, the amount of energy-absorbing dye (i.e., dye which absorbs electromagnetic energy at the wavelength of the stimulating light, e.g., red light) in the storage plate can be manipulated to control the amount and profile of the lateral diffusion of the stimulating light as shown in FIGS. 7a-7c. Each pair of graphs in FIGS. 7a-7c shows the absorption profile of the red stimulating light (top graph) and the point spread function of the resulting blue stimulated light (bottom graph) for different concentrations of red-absorbing dye in the plate as simulated using the Monte Carlo simulation technique. Each gradation in the respective graphs represents a 10% increment.

The graphs of FIGS. 7a-7c indicate that it is now possible, with the techniques described herein, to indirectly stimulate the plate with the same energy level across its entire depth. These graphs illustrate the fact that, as the stimulating light diffuses further and further away from the exposed edge, its energy distribution becomes homogeneous across the entire thickness of the plate. This phenomenon can be used to create an x-ray imaging system with very high resolution and yet very good x-ray absorption.

Since very bright illumination can be easily achievable (multiple rows of high-power red LEDs), it is possible to reach full bleaching of the plate at only 10% of the direct stimulating light intensity. With a high amount of red-absorbing die, the plate can be read out through its entire depth across a very narrow strip. This configuration is particularly useful for mammography imaging, which requires high resolution as well as high x-ray absorption (i.e., high DQE). It is therefore theoretically possible to achieve higher resolution across the mechanical scanning direction than across the direction of the linear CCD.

In the direction of the linear CCD, the resolution is limited by the lateral diffusion of the stimulating light as well as the stimulated light. In the direction of the mechanical scanning, the resolution is only limited by the lateral diffusion of the stimulating light (which can be controlled by the amount of red-absorbing dye) and not by the lateral diffusion of the stimulated light. The photodetectors aperture (along the direction of the mechanical scanning) does not impact the resolution but simply the collection efficiency. Even with a 200 µm photodetector aperture, it is possible to achieve much finer resolution (as low as 20 µm).

Using a Monte Carlo computer simulation, one can optimize the phosphor grain size, the red-absorbing dye concentration and the plate thickness to achieve maximum performance for a particular application. This method offers great potential for achieving very high resolution and high x-ray absorption without relying on needle phosphor technology. Current products used for mammography and other high-resolution x-ray imaging utilize dentritic phosphor layers (needles of Cesium iodide CsI) to channel the emitted light across the thickness of the plate. These phosphor layers are very expensive and difficult to manufacture. In addition, they are very hygroscopic and exhibit objectionable image burn-in (i.e., areas of the needle phosphor strongly exposed to x-rays exhibit higher luminous gain than surrounding areas).

Using the method of stimulation and collection described herein, the resolution of a turbid storage-phosphor plate in the direction of mechanical scanning can be as high as the resolution of a needle phosphor plate. This is true even when a thick storage-phosphor plate (i.e. 300 µm) is used to capture high energy x-rays.

Figure 8:
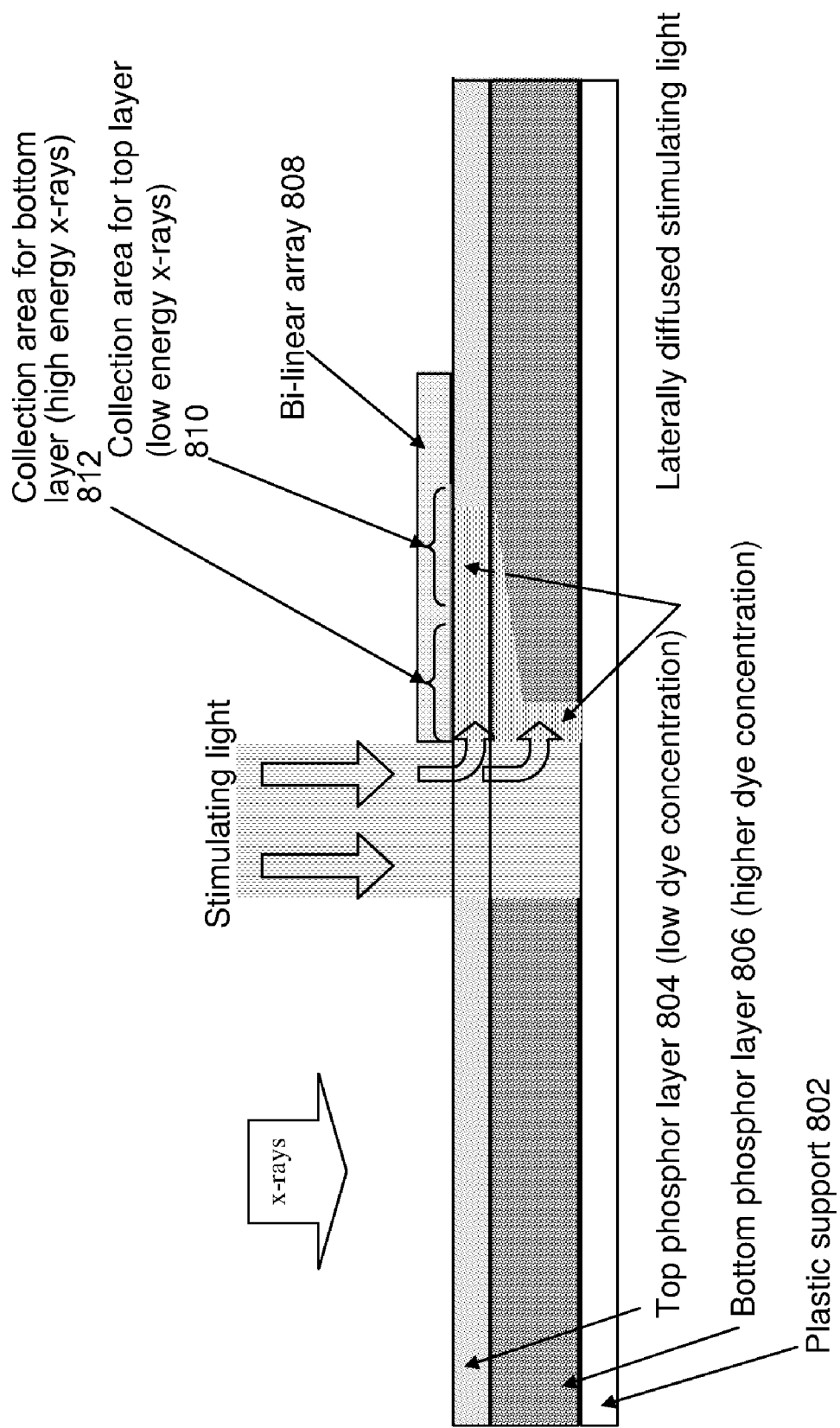
FIG. 8 is a simplified diagram of a dual-layer phosphor plate designed according to and for use with specific embodiments of the present invention.

In another embodiment shown in FIG. 8, two layers of storage-phosphor material are deposited on the same substrate 802. The top layer 804 contains a small amount of dye which is meant to absorb weakly the stimulating light, the bottom layer 806 contains a higher amount of dye which is meant to absorb strongly the stimulating light. When scanned with a bilinear photodetector array 808 using the method described herein, the top layer 804 is stimulated further away from the edge of the direct stimulating light exposure than the bottom layer 806. According to a more specific embodiment, stimulated light from the top layer is collected in the first row of photodetectors 810 whereas stimulated light from the bottom layer is collected in the second row of photodetectors 812.

In addition and because of the x-ray absorption characteristics of the storage-phosphor material, the top layer 804 absorbs low energy x-rays whereas the bottom layer 806 absorbs higher energy x-rays. Similarly, soft material (such as human soft tissue) absorbs preferentially low energy x-rays whereas dense material (such as human bone) absorbs preferentially high-energy x-rays. Therefore, according to another specific embodiment of the invention, information collected from the top and bottom layers is used to create a dual-energy image. Dual energy data may then be processed to extract information corresponding to bone or soft tissue only. In addition, images may be created which display bones only or soft tissue only. In general, a variety of embodiments are envisioned using multiple layers of various storage-phosphor materials and multiple rows of photodetectors to achieve dual-energy imaging.

Figure 9:
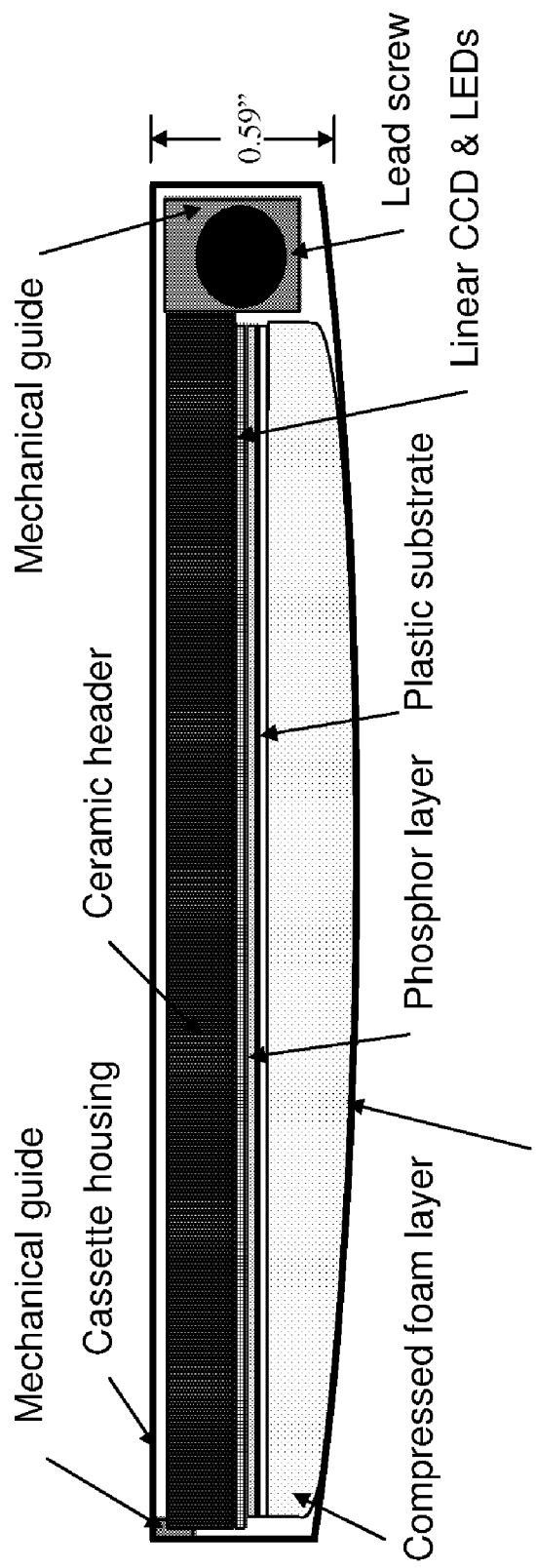
FIG. 9 is a simplified diagram of phosphor plate in a cassette housing illustrating a specific embodiment of the invention.

Traditionally, phosphor plates are manufactured on a flexible substrate (PET, Mylar) like prompt phosphor screens. These plates are either mounted on a hard backing (e.g., an aluminum plate) or are kept flexible in order to be transported and read in the laser scanning apparatus. Therefore, according to a specific embodiment of the present invention, in order to maintain sufficient contact between the surface of such a flexible phosphor plate and the light collection apparatus, e.g., a fiber-optic face plate, the phosphor plate is mounted on a thin foam layer which is compressed when the light collection apparatus is pressed against the surface of the plate. According to a more specific embodiment, where the light collection apparatus is held at each side, the foam can be make thicker at the center of the plate than at the edge to ensure sufficient contact across the entire width of the plate (e.g., see FIG. 9).

The Fiber-Optic Faceplate

According to various embodiments, the fiber-optic faceplate of the present invention (e.g., plates 302 and 420 of FIGS. 3 and 4) may serve two purposes, i.e., creation of a knife-edge alignment for the stimulating light, and collection of the stimulated light onto the photo detectors. As mentioned above, the edge of the faceplate defines the illumination boundary and its sharpness is important for achieving optimal performance. To protect the physical integrity of the edge of the fiber-optic faceplate, another such faceplate can be mounted against it (e.g., plate 416 of FIG. 4) or, alternatively, a clear block of transparent material (e.g., glass or plastic) can be mounted against it. The choice of material will depend on the amount of collimation required for the stimulating light. If no additional collimation is required, a clear material can be used. If additional collimation is required, another fiber-optic faceplate can be used to transport the stimulating light onto the plate. As will be understood, the amount of additional collimation is determined by the numerical aperture of the fiber-optic faceplate. If a low numerical aperture is chosen, the stimulating light hitting the plate will be highly collimated. Regardless of the nature of the block mounted against the collection face plate, the edge of the collection faceplate is protected against chipping or other damage during operation.

According to a specific embodiment and to facilitate its mounting onto the linear array of photodetectors, the fiber-optic faceplate may be cut at a slight angle with respect to the direction of the fibers as shown in FIG. 4. Such a slight bias cut may allow for an easier alignment of the faceplate onto the linear array without reducing significantly its transmission characteristics, e.g., a bias cut angle of less than 10 degrees will result in a 10% transmission reduction.

According to other specific embodiments of the invention, the collection fiber-optic faceplate may also serve another important purpose. That is, it can be configured to block partially or completely the stimulating light. In order to provide such blocking, the fiber-optic faceplate may be constructed from materials which absorb the stimulating light and transmit the stimulated light. Such materials may include optical filter materials such as ionically colored glass e.g. Schott BG3. However, the difficulties associated with drawing such materials into fibers and bundling them into fiber-optic faceplates (e.g., such glasses have a low refractive index and are not stable through various heat treatments) may not make them the best materials for such an implementation.

Other materials such as rare earth doped filter glasses are better candidates for fiber-optic faceplates. Developed originally for their fluorescence properties, rare earth doped filter glasses may also be used as a filter material. In particular, Thulium doped glass has good transmission characteristics at 400 nm and good absorption characteristics at 680 nm. Therefore, according to a specific embodiment of the invention, a low index host glass and a high index host glass are doped with Thulium to create a cladding and a core material. These core and cladding materials are then bundled together to create fiber-optic faceplates for use with the present invention having good transmission characteristics (i.e., high numerical aperture) and good rejection of stimulating light.

As is well known, the transmission of a fiber-optic faceplate is a function of the numeral aperture of each fiber. The numerical aperture of each fiber increases as the difference in refractive indexes between the core and cladding increases. Fiber optic faceplates are traditionally manufactured from glass since high index and low index materials are easily available. This has not been the case for plastic materials, i.e., most of them tend to have a refractive index close to 1.4. A new plastic material is now commercially available from the Florida-based company Optical Polymer Research Inc. Until recently, most fiber-optic faceplates have been manufactured from glass since materials having a sufficient index differential are easily available. Recently, a new class of plastic material has been developed. This new material, marketed under the name Opti-Clad, has a very low refractive index (less than 1.36) and as such is suitable for use as a cladding material around, for example, a styrene core (refractive index close to 1.59). Teflon is also another good cladding material since its refractive index is 1.3. As a result of this advance in materials science, it is now possible to manufacture plastic fiber-optic faceplates with high numerical apertures. According to a specific embodiment of the present invention, an energy-absorbing dye is introduced into the plastic employed to make such a fiber-optic faceplate to obtain a faceplate with a high numerical aperture and good rejection of stimulating light.

Another approach to blocking the stimulating light involves the use of a reflective (rather than refractive) cladding material in the fibers of the fiber-optic faceplate. Such fibers are not ideal for transmission of light energy over long distances due to the loss of energy at each reflection. However, given the short distance contemplated in most implementations of the present invention (e.g., less than 1"), such fibers will be sufficiently transmissive.

As discussed above and according to various embodiments, the fiber optic faceplate may be useful for creating a knife-edge for the stimulating light, for collecting and imaging the stimulated light onto the photodetectors, and additionally for preventing the stimulating light from reaching the photodetectors. It is possible however to implement the present invention without using a fiber optic faceplate (as shown in FIGS. 1 and 2).

It is also possible to use a plain transparent layer (glass or plastic material) between the image plate and the photodetectors so as to prevent the bonding wires from touching the image plate. If no precautions were taken, such a transparent layer would introduce an unacceptable amount of blurring due to the fact that the image plate is a Lambertian emitter and the stimulated light would diffused in all directions in the transparent layer before reaching the photodetectors. On one hand, the thickness of the transparent layer must be kept to a minimum to prevent blurring; on the other hand the layer must be thick enough to provide the necessary clearance between the plate and the photodetectors for the bond wires. According to specific embodiments of the present invention, a number of techniques can be used independently or in conjunction in order to reach the correct compromise.

Figure 10:
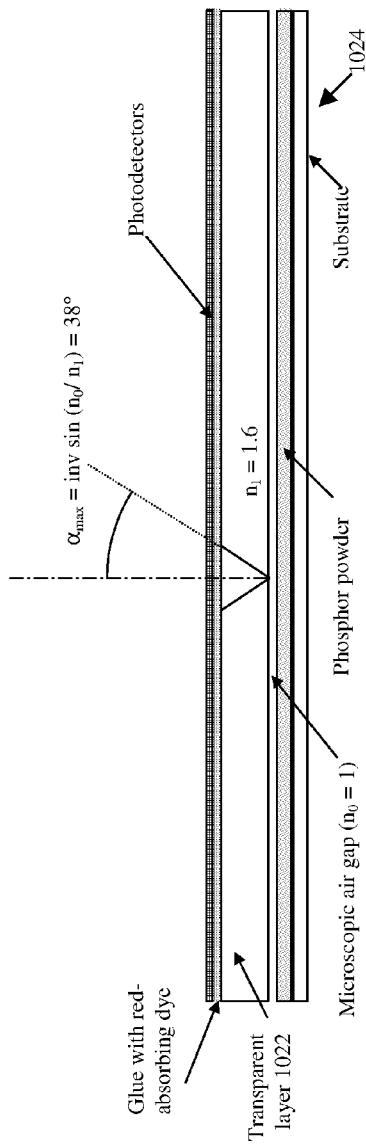
FIGS. 10a-10c illustrate three different approaches to providing an interface between a storage plate and a photodetector array according to the present invention.
Figure 10:
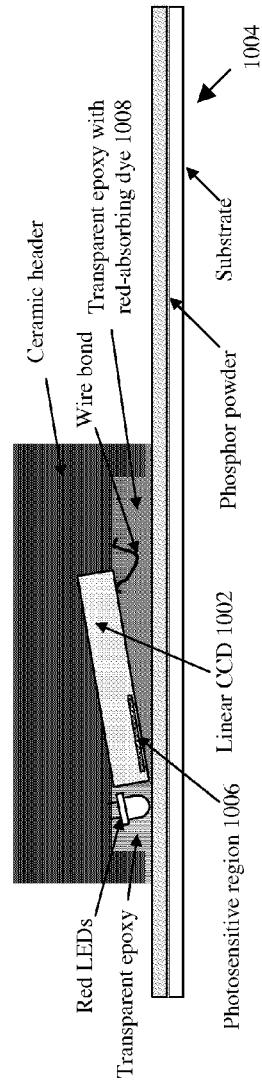
Figure 10:
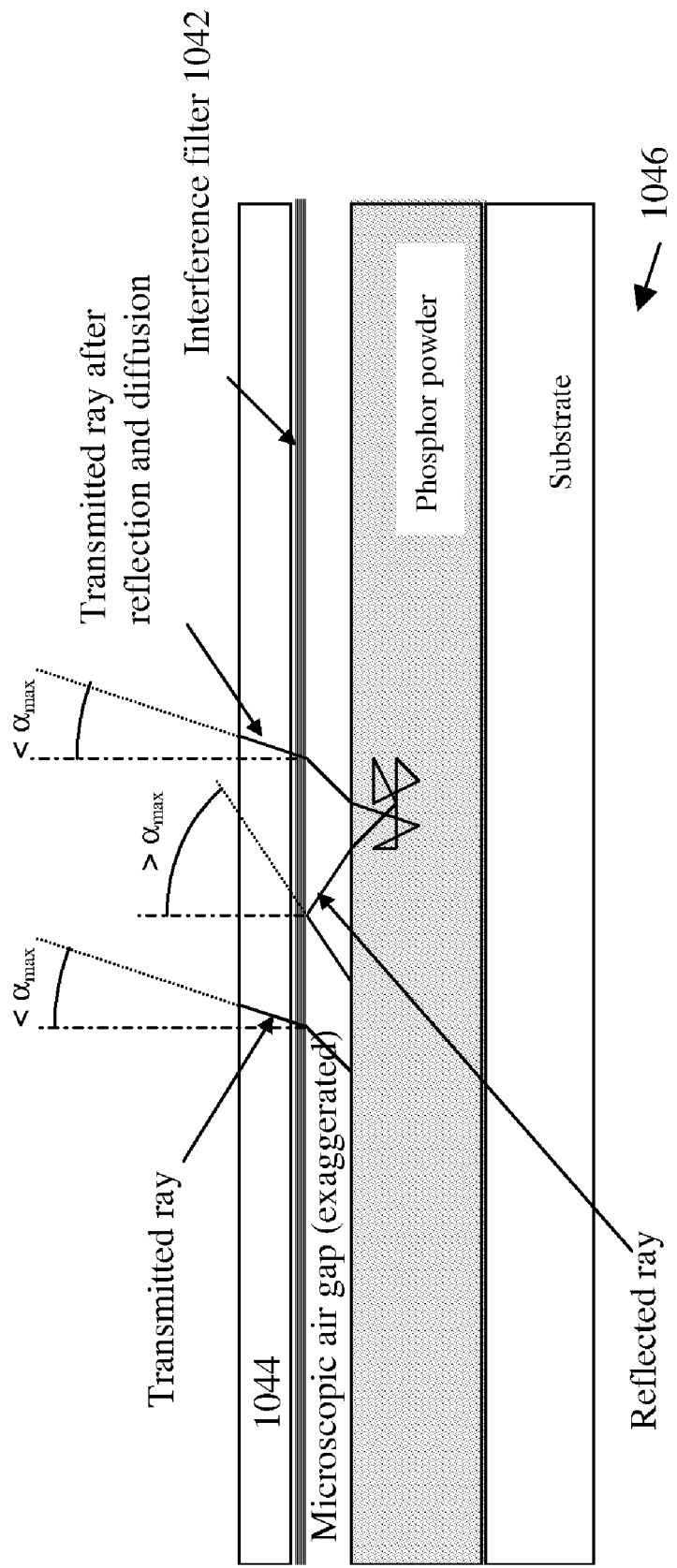

According to a first such technique, a beveled transparent layer is employed which is thin above the photosensitive area of the linear array and thick above the bonding area of the linear array. This implies that the linear array is not positioned parallel to the image plate. As shown in FIG. 10*b*, the linear array 1002 is placed at an angle with respect to the plate 1004 so as to bring the photosensitive area 1006 closer to the plate and the bonding area further away from the plate. Using this technique, one can minimize the thickness of the transparent layer 1008 over the photosensitive area and maximize it over the bonding area.

According to a more specific embodiment, the linear array is placed in a cavity and a liquid transparent epoxy is poured over it. Once the epoxy has cured, it creates a hard transparent layer which is thin over the photosensitive area and thick over the bonding area of the linear array. The bond wires can be directly encapsulated by the epoxy or can be first coated with a resilient material (e.g., silicone) before they are covered with the epoxy so as to alleviate issues related to mismatch in coefficients of thermal expansion. In order to guarantee that the surface of the epoxy in contact with the plate will be perfectly flat, it is proposed to create a mold in which the proxy will be poured. For example, the mold can be as simple as a perfectly flat Teflon-coated surface placed in front of the linear array which will hold the epoxy while it is poured and which will be removed after the epoxy has cured. According to one embodiment, a one-part epoxy such as 4021T manufactured by Ablestick is employed. This epoxy will adhere to glass and silicon but will not stick to the Teflon-coated surface. The transparent epoxy can also contain the absorbing dye necessary to block out the stimulating light (as it is described further on in this document).

A second technique illustrated in FIG. 10*a* comprises using a transparent layer 1022 made of a high index material (n~1.6). Light emitted from the plate 1024 will be refracted in the high index material 1022 at a smaller angle with respect to the normal incidence (Snell law). The resulting blurring will thus be reduced.

A third technique illustrated in FIG. 10*c* comprises depositing an interference filter 1042 on the surface of the transparent layer 1044 in contact with the image plate 1046. The purpose of the interference filter is to transmit the stimulated light emitted by the plate that reaches the filter at angles close to normal incidence, and to reflect back to the plate the stimulated light that reaches the filter beyond a certain angle. This type of interference filter is used in front of prompt-emitting phosphors in order to create a forward-peaking distribution, that is to increase the intensity of the light emission in the forward direction and to decrease it in the off-axis directions. This technique is particularly useful for maximizing the optical coupling between a CRT phosphor screen and a projection lens (e.g., in a large-screen TV), or between a prompt emitting phosphor and a lens-based camera (Norikata Satoh, SPIE volume 2432 page 462-469). This technique increases the intensity of the light emitted in the forward direction at the expense of the spatial resolution. This technique is used in this invention not for the purpose of collecting more light but for the purpose of rejecting off-axis light that contributes greatly to the blurring effect.

Regardless of which material is used over the linear array (e.g., fiber optic faceplate, glass, plastic or epoxy layer), this material should not scratch the image plate. Removing dust and dirt from the contact area will reduce chances of scratches. In a specific embodiment, an additional layer of Teflon-like material is coated on the plate or the material itself to reduce friction between the two surfaces. In another specific embodiment, the outer edges of the surface in contact with the image plate are beveled or rounded to reduce the chances of scratches.

The Source of Stimulating Light

Various embodiments of the present invention have been described herein in which the source of stimulating light comprises a row of light emitting diodes (LEDs) mounted close each other. Such arrays of LEDs are available commercially, e.g., StockerYale linelights. Examples of such modules include 100 LED chips mounted directly on 100 mm substrate with a spacing between each LED of 1 mm. The overall illumination of a typical LED array is fairly uniform across the length of the array. One of the advantages of the method of light stimulation proposed in the present invention is that it can be made relatively insensitive to variations of illumination across the length of the array by ensuring that the amount of illumination is sufficiently high to bleach the entire depth of the plate. According to one embodiment, reaching this threshold is ensured by including one or more additional rows of LEDs next to the first row in order to increase the amount of stimulating light in the plate.

According to a specific embodiment, the LEDs' peak emission wavelength matches the peak absorption wavelength of the filter which is placed between the plate and the photodetectors. In addition, the LEDs are chosen to have an emission spectrum range which is narrower than the effective absorption range of the filter. In one embodiment where this is not the case, an additional filter is added between the LEDs and the plate. The purpose of this additional filter is to block any wavelength of stimulating light which would not be blocked by the primary filter between the plate and the photodetectors. In another specific embodiment, control circuitry is provided to adjust the brightness of the LEDs. The control circuitry can be used to reduce the brightness of the LEDs in order to achieve partial bleaching of the plate.

In yet another specific embodiment, additional rows of different color LEDs are provided to achieve greater erasing efficiency. It has been demonstrated that storage-phosphor plates are more efficiently erased under broadband illumination than monochromatic illumination. Therefore, adding rows of ultra-violet, blue, green, yellow, orange or infrared LEDs to the rows of red LEDs is proposed to simulate broadband illumination and increase the erasing efficiency.

It has also been demonstrated that some storage-phosphor plates are more efficiently erased using a two-stage erasure method. Such a two-stage erasure method is described in Fuji Computer Radiography Technical Review No. 2 (New Technological Developments in the FRC 9000) on page 18. It consists of exposing the plate to ultra-violet light in a first stage, and to broadband illumination without ultra-violet light in a second stage. Fuji implements this method by passing the plate over a stack of high brightness fluorescent light tubes, where some of them are directly exposed to the plate and some are covered with a UV cut-off filter.

A specific embodiment of the present invention introduces a novel way to implement a two-stage erasure method. Fluorescent tubes are replaced with rows of LEDs. A first erasure stage is constructed using UV LEDs only. UV LEDs are now commercially available from a number of manufacturers (e.g. Nichia NSHU-550E or NSHU-590E). These LEDs put out approximately 1 mW between 370 nm and 375 nm. They also produce a very low visible output (dim purple glow) which can be easily filtered out. A second erasure stage is constructed using various other color LEDs which did not produce any UV light.

The Linear Array of Photodetectors

The linear array of photodetectors for use with the present invention (e.g., arrays 114, 202, and 404 described above) can be built in a variety of different ways. For example, discrete photodetectors can be mounted in a single row and connected to a multiplexing circuitry. Alternatively, an amorphous silicon array of photodetectors can be used. In order to achieve a low-noise readout, photodetectors built on a single crystal silicon substrate are preferred. Such linear arrays can be manufactured using charge-coupled device (CCD) or CMOS technology. CMOS technology for image sensors has improved tremendously in the last few years and the performance characteristics of CMOS image sensors are approaching those of CCDs. It should be understood that the present invention does not exclude any of the available photodetection technologies. With regard to the performance of linear CCDs, various embodiments of the present invention provide further enhancements which will now be described.

Conventional linear CCDs rely on photodiodes or junction gates as a photodetectors. Both designs provide photodetectors with high quantum efficiency (~60%) in the blue region of the spectrum because they are not covered by the polysilicon gates used in the register (which absorb strongly in the blue). The intrinsic quantum efficiency of today's linear CCDs is close to the theoretical limit. However, the extrinsic quantum efficiency is lower due to the large amount of light reflected off the silicon surface. This, in turn, is due to the fact that the refractive index of silicon is high. Successful attempts have been made to improve the quantum efficiency of back-illuminated area CCDs through the use of anti-reflective coatings. However, no product nor literature has reported any similar efforts to improve the quantum efficiency of conventional front-illuminated linear CCDs. Therefore, the present invention provides antireflection coatings for linear CCD arrays to reduce the amount of reflection off the silicon surface. Multi-layer coatings (e.g., Haffnium oxide) can be used to increase the quantum efficiency of front-illuminated linear CCDs from 60% to 95% at 400 nm (e.g., the wavelength of stimulated light). In addition, such multi-layer coatings can also be used to decrease the quantum efficiency of front-illuminated linear CCDs from 80% to 1% by reflecting light at 650 nm (e.g., the wavelength of stimulating light). That is, these multi-layer coatings can be implemented to act as a blocking filter for the stimulating light and an antireflective layer for the stimulated light.

As discussed previously, conventional linear CCDs rely on photodiodes or junction gates as a photodetectors. In order to create such photodiodes or a junction gate photodetectors, additional process steps are taken which increase the cost and complexity of the CCD manufacturing process. An easier and cheaper process could be used to manufacture linear CCDs, such as the one used for full-frame area CCDs, but it would be at the expense of the blue quantum efficiency. Full-frame area CCDs use a simple manufacturing process in which the vertical registers act as photodetectors. They exhibit a low quantum efficiency in the blue region of the spectrum (~10%) because the vertical registers are covered with polysilicon gates which absorb strongly at these wavelengths. Attempts have been made to increase the blue quantum efficiency by thinning the polysilicon gates or removing such gates over parts of the photodetector area.

Therefore, according to a specific embodiment of the invention, a technique is introduced to increase the blue quantum efficiency of linear CCDs manufactured using a conventional full-frame area CCD process. The proposed photodetector layout includes a narrow polysilicon gate (i.e., a photogate) surrounded on both sides by wide channel stop regions (which are not covered by polysilicon gates). This photodetector design is dramatically different from conventional linear CCD photodetectors since the channel stop region between the photodetectors is much wider than the photodetector itself (see the comparison in FIGS. 11*a* and 11*b*).

Traditionally, narrow channel stop regions 1102 are implanted between photodetectors 1104 to form a sharp potential barrier between them (FIG. 11*a*). The channel stop region exhibits high quantum efficiency but no strong electric field, so electrons generated in that region can laterally diffuse on either sides to the two adjacent photodetectors. In most linear CCD designs, the channel stop width is kept to a minimum to create the sharpest separation possible between photodetectors, thus increasing the contrast (i.e., MTF). The photodetector response can be represented by a trapezoid-shaped curve, which approaches the shape of a rectangle if the channel stops are narrow compared to the photodetector width (FIG. 12*a*).

By contrast and according to a specific embodiment of the invention, channel stops 1152 are wider than the photodetectors 1154 (FIG. 11*b*), which creates a triangular-shaped photodetector response curve (FIG. 12*b*). As can be seen from the figure, this reduces the isolation between adjacent photodetectors (i.e., creates a more overlapping response). According to a more specific embodiments, this effect is mitigated by providing photodetectors on a finer pitch than the required resolution and combining their signals at the output of the CCD register (analog binning technique) or after they have been digitized (FIG. 12*c*). This design achieves the original goal of increasing the blue quantum efficiency and also helps decrease the dark current generation in the photodetector since channel stop regions generate less dark current than CCD channels.

According to another embodiment, an area CCD is used to emulate a linear CCD, i.e., signals from the photodetectors of the same column of an area CCD are combined in the horizontal output register to form a single large-aperture photodetector. For example, five 44 μm×44 μm photodetectors may be binned to emulate a 220 μm×44 μm photodetector. The proposed area CCD resembles a Time Delay Integration (TDI) CCD in its aspect ratio (5×2,048 pixels), but it is not used in a TDI mode. This design alleviates the serious problem of readout lag encountered with large-aperture photodetectors.

Figure 13:
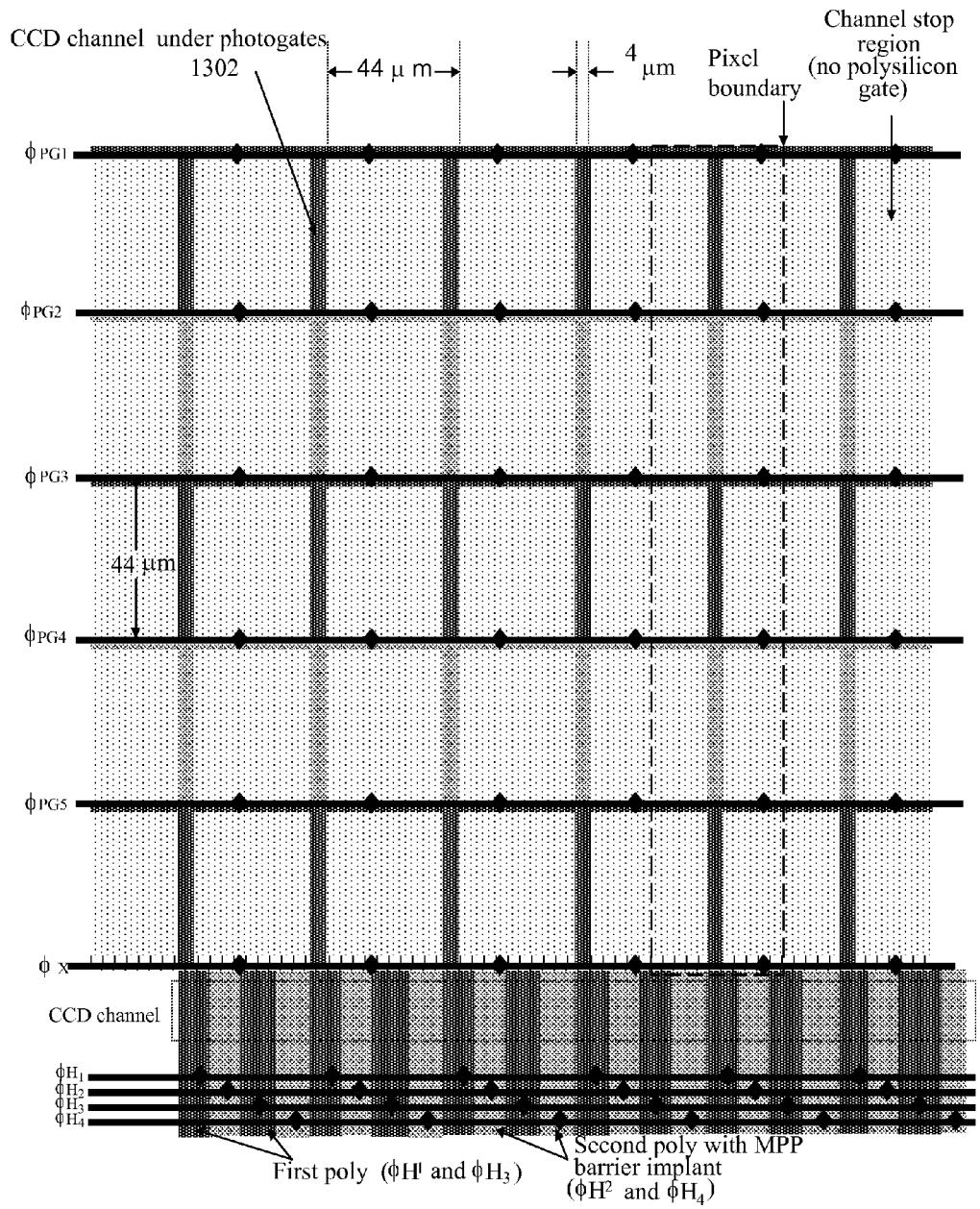
FIG. 13 shows the architecture of an area CCD for use with a specific embodiment of the present invention.

That is, photodetectors with an aperture greater than 100 μm exhibit significant readout lag as reported in the data sheets of linear CCDs designed for barcode readers (e.g., Toshiba TCD1304AP, Sony ILX511). This is due to the fact that the electric field in the photodetector region is not strong enough to move small charge packets across a 100 μm distance into the output register. In the case where an area CCD is used instead of a conventional linear CCD, the gate length can be kept under 15 μm. Since no spatial resolution is required along the columns of the area CCD, larger gates can be used with no implant barriers between them. An example of such a design is illustrated in FIG. 13. Five 44 μm photogates 1302 are laid out vertically along the CCD buried channel. As shown in the associated timing diagram, the photogates are biased negatively during the integration time (MPP mode described below) and clocked briefly in a ripple fashion to transfer the charge packets into the output register.

In this mode of operation, the device is truly a linear CCD since it cannot image in the vertical direction. Even though the device layout resembles one of an area CCD, the photogates can only ripple the charge into the output register but cannot isolate separate charge packets since they are all tied to the same voltage. As described in a previous embodiment (dual-layer plate for dual-energy imaging), it may be necessary to collect information from two adjacent rows of photodetectors instead of one. It is possible to operate the same linear device shown in FIG. 8 as a bilinear device (two adjacent rows of photodetectors) by simply changing the photogates timing. If $V_{PG3}$ is pinned to the substrate while the other four photogates are dithered, $V_{PG3}$ acts as a barrier between a first photodetector (consisting of $V_{PG1}$ and $V_{PG2}$) and a second photodetector (consisting of $V_{PG4}$ and $V_{PG5}$). The fact that four photogates are dithered during the integration time (instead of being pinned to the substrate) does not adversely effect the dark current performance (see MPP operation details below) provided that the dithering of the photogates is fast enough.

At room temperature, conventional linear CCDs generate enough dark current to significantly degrade the image quality required for this application. A solution to this problem is to cool the CCD, which is not a simple task because of condensation issues. To avoid the requirement of cooling the device, a specific embodiment of the present invention provides a method for reducing the dark signal of the linear CCD. This method is inspired from the technology known as MPP, which was developed for areas CCDs only. The MPP technology significantly reduces the dark current generated in the vertical registers of area CCDs. This is accomplished by introducing a weak implant under one gate and by biasing all the gates negatively (total inversion) to pin the Si—SiO$_2$ interface to the substrate voltage (MPP: Multi-Pinned Phase). Further details can be found in the book entitled "Solid-state imaging with charge-coupled devices", A. Theuwissen, on page 289.

This technology has been previously implemented in the vertical registers of area CCDs but not in the horizontal output registers of area CCDs nor in the output registers of linear CCDs. The reason is that the MPP mode only reduces dark current generation when the gates are pinned to a negative voltage, and not when the gates are clocked to a positive voltage. In the operation of an area CCD, the gates of the vertical registers are most of the time pinned to a negative voltage (during the read out of the horizontal output register) and only clocked to a positive voltage during a short period of time (i.e., very low duty cycle). Under such conditions, the MPP mode is very effective. However, timing diagrams are quite different for output registers of area CCDs and linear CCDs. That is, the gates of such devices are usually clocked constantly and do not get pinned to a low voltage for any significant length of time (i.e., the high duty cycle of FIG. 14a). Under those conditions, the MPP operation would not be effective at all and this is why it has not been implemented on any commercial devices.

According to a specific embodiment of the invention, the MPP mode is implemented in the output register of a CCD by introducing an MPP barrier implant under one gate and by clocking all the gates in a burst mode instead of a continuous mode (FIG. 14b). Modifying the timing diagram of the register from continuous mode to burst mode changes the duty cycle from a high duty cycle to a low duty cycle. This allows for all the gates to be pinned to a low voltage for a significant length of time, thereby making the MPP mode effective for such devices.

According to be another specific embodiment of the invention, the MPP mode is implemented in four-phase CCD output register by introducing an MPP barrier implant under two gates (instead of one) of the four phases. Referring to FIG. 13, the MPP barrier implant is under the gates $\phi_{H2}$ and $\phi_{H4}$ but not under the gates $\phi_{H1}$ and $\phi_{H3}$. This design allows for great flexibility in the operation of the output register. The output register can be operated in a conventional four-phase clocking mode (as shown in FIG. 18). The output register can also be operated in a two-phase clocking mode by connecting two adjacent gates. With $\phi_{H1}$ and $\phi_{H2}$ connected to each other and $\phi_{H3}$ and $\phi_{H4}$ connected to each other, the output register moves charge from right to left (see FIG. 18). With $\phi_{H1}$ and $\phi_{H4}$ connected to each other and $\phi_{H2}$ and $\phi_{H3}$ connected to each other, the output register moves charge from left to right (see FIG. 18). This design combines the simplicity of operation of a two-phase output register (two input clocks instead of four) with the flexibility of a four-phase output register (bi-directionality of charge transport).

Linear CCDs have been designed historically for industrial and document scanning applications and, as a result, have not benefited from some of the technology advances made with regard to scientific area CCDs. For example, linear CCDs feature high-speed readout amplifiers (e.g., the two-stage FET amp shown in FIG. 15a) but not low-speed, low-noise readout amplifiers. Therefore, the present invention provides a linear CCD for use with various embodiments using a low-speed low-noise amplifier (e.g., a single-stage FET amp) (FIG. 15b). The purpose of this design is to achieve a readout noise close to 10 electrons at 500 kHz as compared to the readout noise of a conventional linear CCD which is close to 300 electrons at 5 MHz.

The above-mentioned improvements are intended to improve the dynamic range of linear CCDs. However, even with such improvements the dynamic range of linear CCDs is still significantly lower than the dynamic range of photomultipliers. Therefore, in order to more closely match the performance of laser scanning image plate readers (which utilize photomultipliers), it is important to further increase the dynamic range of linear CCDs. A number of techniques are available to further increase the dynamic range of linear CCDs. One such technique described in U.S. Pat. No. 5,055,667 consists of creating a nonlinear photosite response.

According to a specific embodiment of the invention, a technique is provided in which the binning of the photodetector signals at the output of the CCD register is dynamically controlled. Analog binning techniques have been used in the past to change the effective photodetector area and overall resolution of CCDs. By contrast, in this embodiment, the binning process is controlled "on the fly" to increase the dynamic range of the system as opposed to modifying its resolution. In a more specific embodiment, a linear CCD with four times as many photodetectors as required is used.

With conventional binning, the signals from four adjacent photodetectors are combined systematically as they reach the output of the register, regardless of their signal value. Unfortunately, at high signal intensity, combining four signals can result in saturation of the readout circuitry (i.e., an undesirable dynamic range limitation). By contrast and according to this embodiment, the signal of only one photodetector is read out and compared to a threshold before deciding if it will be combined with the signals of its three neighboring photodetectors. If the signal value is below a certain threshold, the signals of the following three photodetectors are binned with the signal just measured, and the combined signal is re-measured.

If, on the other hand, the signal value is above a certain threshold, no binning occurs and the signals of the following three photodetectors are either discarded are read individually.

According to further embodiments, additional binning (e.g. combining signals from eight adjacent photodetectors instead of four) is effected in order to further increase the sensitivity of the system, and thus the dynamic range. The term "dynamically-controlled binning" refers to the fact that binning only occurs for certain signal values and the decision process is performed "on the fly". This technique works particularly well in this application because the signal values of neighboring photodetectors are close to each other. This is due to the fact that the photodetectors are small (~20 µm) compared to the point spread function of the storage-phosphor plate (~120 µm).

Figure 16:
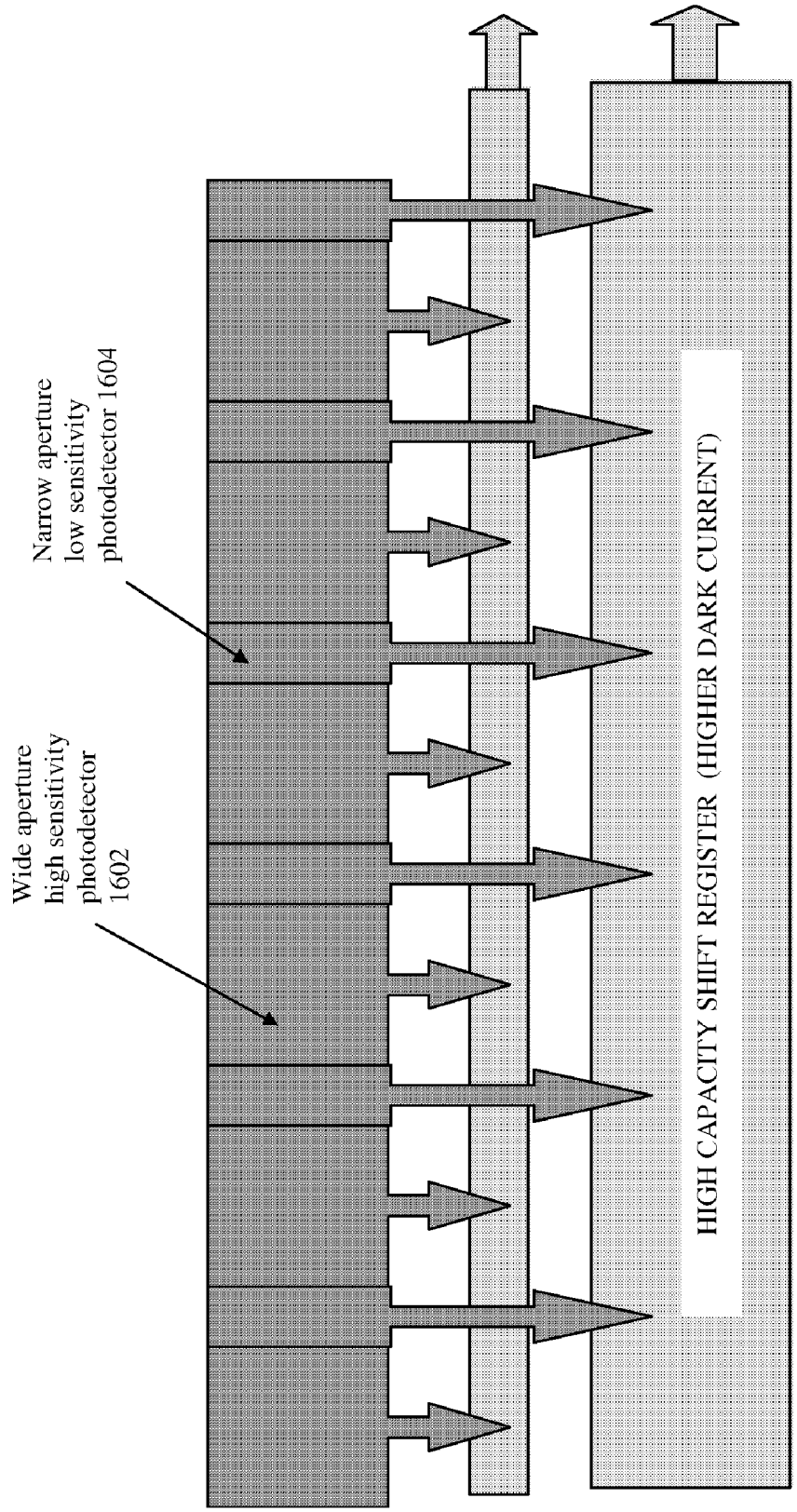
FIG. 16 is a simplified diagram of a bilinear CCD architecture according to a specific embodiment of the invention.
Figure 17:
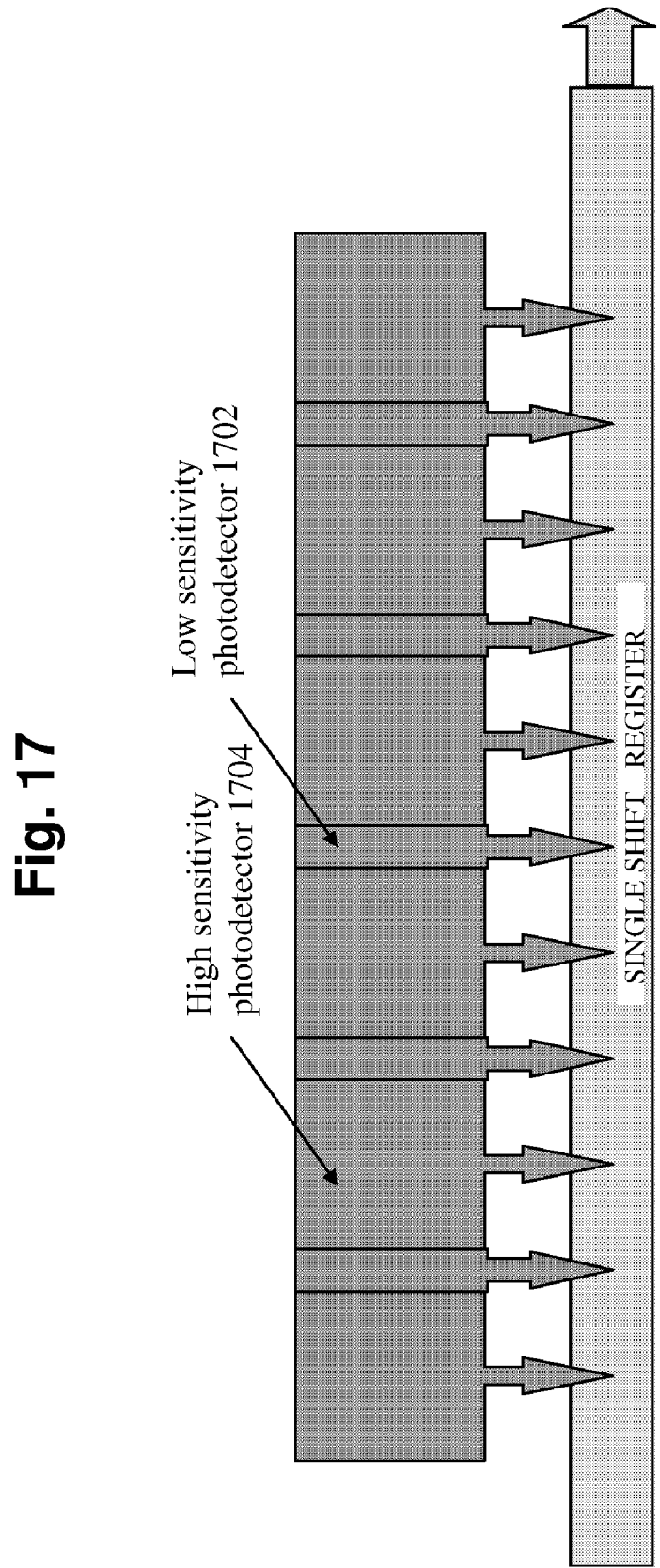
FIG. 17 is a simplified diagram of a linear CCD architecture according to a specific embodiment of the invention.

According to a specific embodiment of the invention, a bilinear CCD is provided (see FIG. 16) in which one shift register collects charges from wide pixels 1602 (high sensitivity) and the other register collects charges from narrow pixels 1604 (low sensitivity) interlaced with the wide ones. According to yet another embodiment of the invention, a single shift register linear CCD is provided (see FIG. 17) in which odd pixels 1702 are narrow and even pixels 1704 are wide.

During the readout process, the narrow pixels are read first and compared to a pre-determined threshold. If the pixel value is above the threshold, the pixel value is validated and the associated wide pixel is discarded (i.e., it contains no information since it is saturated). If the pixel value is below the threshold, the output amplifier is not reset, the associated wide pixel is binned with the narrow pixel, and a combined value is measured and validated. For low signal levels, no information is discarded and all the charges are read. For high signal levels, only a small fraction of the signal is read (ratio between the widths of narrow and wide pixels) but this process does not introduce any additional noise. This readout process can result in significant increases in the dynamic range of the device corresponding roughly to the ratio of the alternating pixel sizes.

Similar binning techniques can be used with different pixel architectures as well as in the cross-scan direction. That is, the pixel value information along each line can be dynamically compared to a pre-determined threshold to determine which mechanical scanning pitch is appropriate. If the signal levels are very low, a larger sampling pitch can be used to maximize the sensitivity. If, on the other hand, the signal levels are high, a smaller sampling pitch can be used to maximize the spatial resolution. This dynamic resolution/sensitivity optimization can be implemented along the scanning direction as well as the cross-scanning direction. It should be noted that these dynamic range extension techniques are particularly important where the dynamic range of the CCD output amplifier has been intentionally reduced to maximize its sensitivity.

Another unique CCD design feature is provided for use with various embodiments of the invention, i.e., the photosensitive area is kept as close as possible to the long edge of the chip since this edge defines the boundary of the illumination area and therefore the area where the stimulated light is generated. Conventional linear CCDs have been designed for industrial and document scanning applications and therefore have their photosensitive area placed in the center of the chip (typically 1 mm to 2 mm away from the edge). According to various embodiments of the invention, the techniques developed for scientific buttable area CCDs are utilized to manufacture a linear CCD which has minimal dead space between its photosensitive area and three edges of the chip (e.g., typically less than 50 µm). The minimal dead space along the long edge facilitates maximum light collection. The minimal dead space at each extremity of the linear array allowing the abutting of multiple arrays to create an uninterrupted photosensitive area.

The maximum length of a linear CCD array is determined by the size of the wafer on which it is manufactured. Typically 5" or 6" wafers are used to manufacture CCDs. This sets the practical limit for the length of the linear CCD below 4". In order to read a standard 14"×17" medical plate in a single pass, it is necessary to mechanically butt a number of linear CCDs. According to one embodiment, 4 mechanically-butted CCDs are employed, each featuring a single row of 2048 pixels on a 44 µm pixel pitch. Each CCD is 9 cm long by 0.2 cm wide.

According to further embodiments, a special coating may be applied to the photodetectors to bring the frontside quantum efficiency up to, for example, 95% at 390 nm. Each CCD features two very low noise single-stage amplifiers (8 e⁻@ 30° C. & 400 kHz). The shift register well capacity is sized for optimal dynamic range and room temperature dark signal. The CCD pixels may also be sized for optimal dynamic range and room temperature dark signal (for example 9 µm wide odd pixels and 81 µm wide even pixels). Another specific embodiment for a linear CCD is presented in FIG. 18.

The Filter Blocking Stimulating Light

A number of techniques have already been described herein for preventing the stimulating light from reaching the linear array of photodetectors. According to further embodiments of the invention, additional steps may be taken to block the stimulating light. According to such embodiments, multi-layer interference filters may be deposited on either or both sides of the fiber-optic faceplate. According to more specific embodiments, an energy-absorbing material which absorbs electromagnetic energy at the wavelength of the stimulating light (e.g., red light) is added to the optical cement which is used to bond the fiber-optic faceplate to the linear array, or in the optical epoxy which is used as a transparent layer between the plate and linear array. A typical glue line thickness between the fiber-optic faceplate and the linear array is 20 µm. If the glue line thickness is much thicker than 50 µm, a loss of spatial resolution may occur.

Certain dye materials can be manufactured with extremely high absorption characteristics (e.g. cyanines). Therefore, according to specific embodiments, such dyes are mixed in epoxy materials in high concentration so as to absorb all the stimulating light within a very thin layer (e.g., less than 20 µm). One example of such a dye is a product manufactured by American Dye Source, Inc. (Quebec, Canada) referenced ADS 640HI and with the chemical formula $C_{39}\,H_{55}\,N_2\,I$. Its extinction coefficient is 200,000 l/mol/cm at 643 nm. Its solubility is roughly 0.05 mol/l. For a 10 µm thickness (0.001 cm), the transmission at 643 nm is therefore $10^{-10}$, which is sufficiently low to guarantee that no stimulating light will reach the photodetectors In addition, since some of these dyes are fluorescent (e.g., laser dyes), further embodiments of the invention provide additional absorbing material in the epoxy to block the fluorescent light created by the fluorescent dye.

According to other embodiments, the chemical composition of the dye is changed to quench its natural fluorescence. Quenching the fluorescence of laser dyes in the red region of the spectrum has not previously been achieved. Other techniques have been used to circumvent this problem. For example, European patent application EP 1 065 525 A2 describes a method for filtering out the fluorescence of the laser dye by combining it with a conventional colored glass filter (e.g. 1 mm Schott BG39). The conventional colored glass filter does block the fluorescence of the laser dye but introduces an unacceptable additional thickness in the optical path. It is desirable to eliminate the fluorescence without introducing an additional filter layer.

Therefore, according to one embodiment of the present invention, the chemical composition of the laser dye is modified to stop it from fluorescing. This goes against traditional approaches which have been aimed at maximizing (rather than minimizing) the fluorescence of laser dyes in order to increase the laser efficiency. This embodiment is based on the fact that certain infrared dyes do not fluoresce, such as the dye ADS812MI manufactured by American Dye Source. ADS812MI has a peak absorption at 812 nm and the following chemical formula: $C_{40}\,H_{40}\,Cl\,N_2\,I$. It appears that the presence of chlorine in the molecule may relate to the fact that this dye does not fluoresce. Therefore, according to this embodiment of the invention, chlorine is introduced into the chemical composition of the red dye (as a form of perchlorate for example) to inhibit its natural fluorescence.

The Scanning Mechanism

One scanning mechanism for use with the present invention (e.g., readout apparatus 504 and actuator 508 described above) is a bi-directional translation stage on which the linear photodetector array and the row of illuminating LEDs are permanently mounted. According to a specific embodiment and as previously described herein, the forward scanning direction of the stage is used to read and erase the plate simultaneously, whereas the reverse scanning direction of the stage may be used for additional erasing of the plate (if necessary) in addition to bringing the stage back to its starting position. Due to the asymmetrical stimulation of the plate (knife edge illumination), the reading of the plate can only occur in the forward scanning direction. As will be understood, various mechanisms may be employed to translate the stage across the plate including, for example, a motorized lead screw, a motorized belt, a magnetic linear motor, and an inchworm motor.

It is important to note that all of these stage translation solutions allow for the outer dimension of the stage and scanning mechanism to remain below half an inch (½") in thickness. This dimension is important for the embodiments of the invention intended to fit inside a cassette the size of a conventional film cassette as described above with reference to FIG. 6. Such an accomplishment is particularly impressive when compared to current laser scanning reading apparatus which are roughly the size of a household refrigerator.

For lead screw or belt solutions, the motor (which drives the lead screw or the belt) can be fitted inside or outside the film-like cassette. In embodiments where the motor is fitted inside the cassette, a small electric motor (e.g., Mabuchi motor reference FF-N30VA) may be used since its overall thickness does not exceed 10 mm (less than ½"). Such low-profile electric motors are commonly available since they are used in numerous consumer electronic products (CD players, cassette players, etc.).

Figure 19:
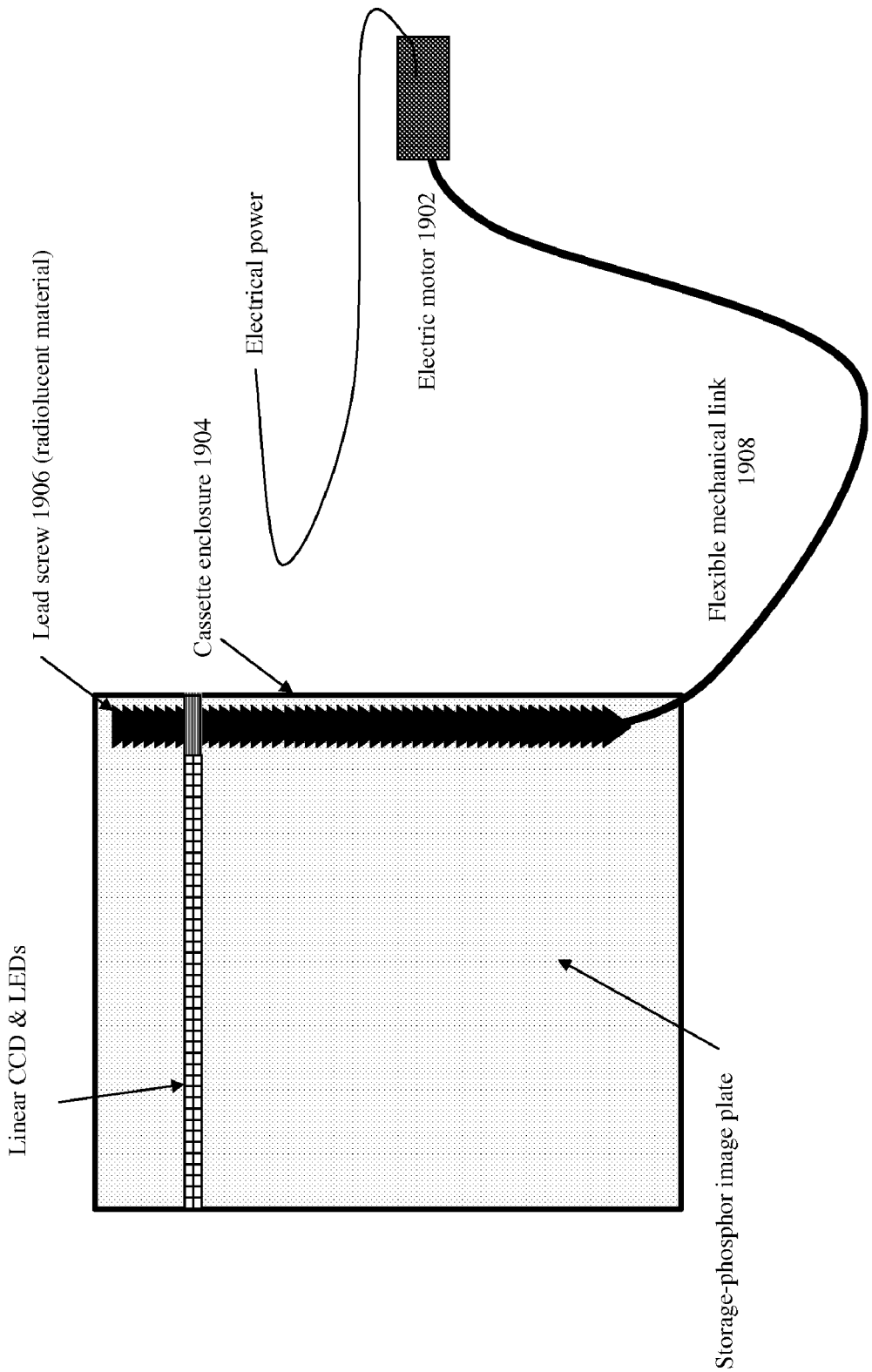
Figures 21A, 21B:
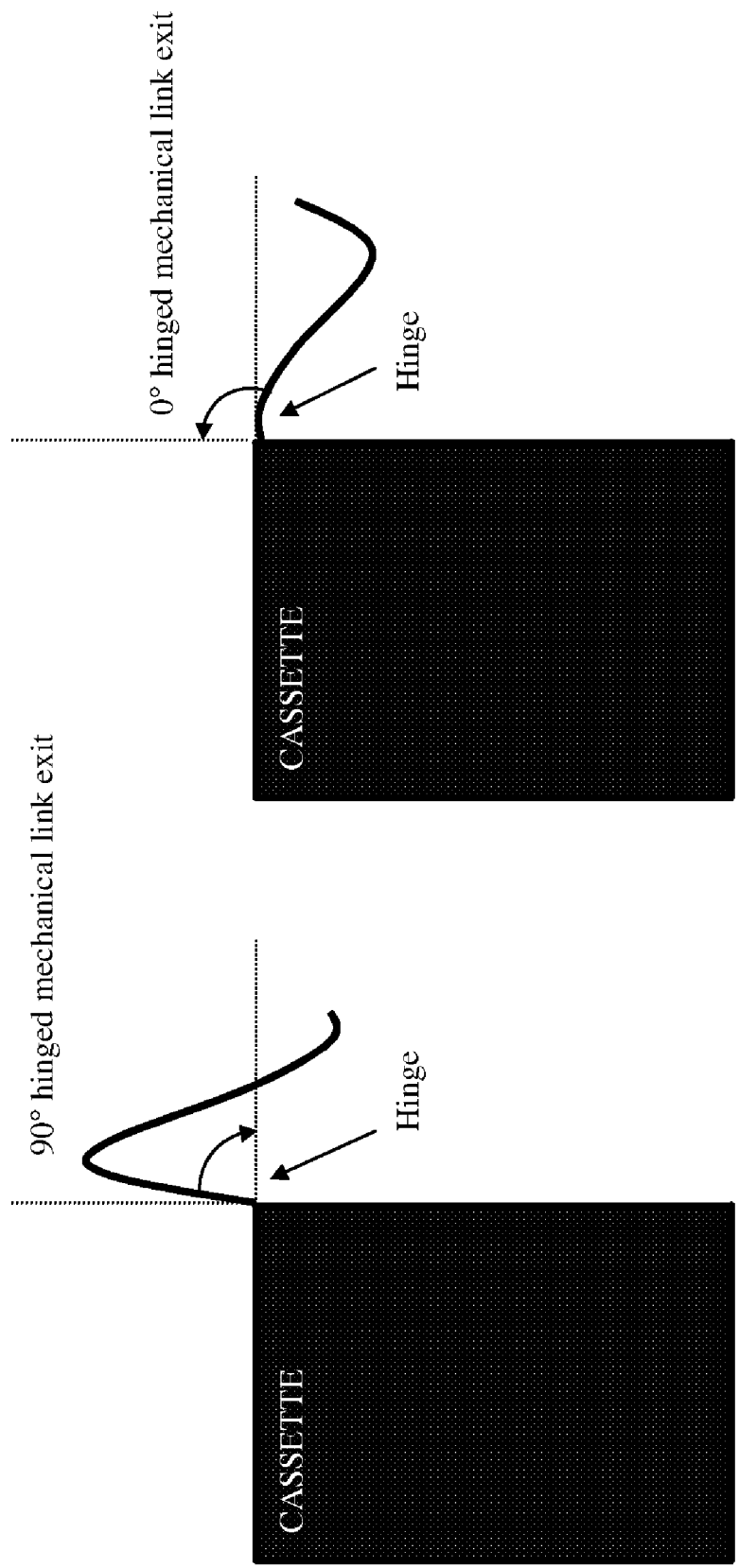

In embodiments (e.g., FIG. 19) where the motor 1902 is disposed outside of the cassette 1904, it is mechanically linked to the lead screw 1906 or the belt (not shown) using, for example, a flexible cable 1908. A distance of a few feet between the cassette and the motor as shown in the figure allows for the necessary clearance and facilitates the insertion of the cassette in a standard "bucky" tray as radiography cassette trays are commonly known. According to a more specific embodiment, the mechanical link exits the cassette at one corner at a 45 degree angle as shown in the embodiments of FIGS. 20a and 20b. Another embodiment connects the mechanical link to the cassette with a hinge assembly as shown in the embodiments of FIGS. 21a and 21b.

These embodiments are intended to allow the cassette containing the readout mechanism of the present invention to fit in most x-ray buckys in portrait or landscape mode without any modifications to the buckys. It is important that while the cassette is inserted in the bucky the cable (which may contain both the mechanical link and the electrical connections to the readout apparatus) exits the cassette without interfering with the tray.

Figure 22:
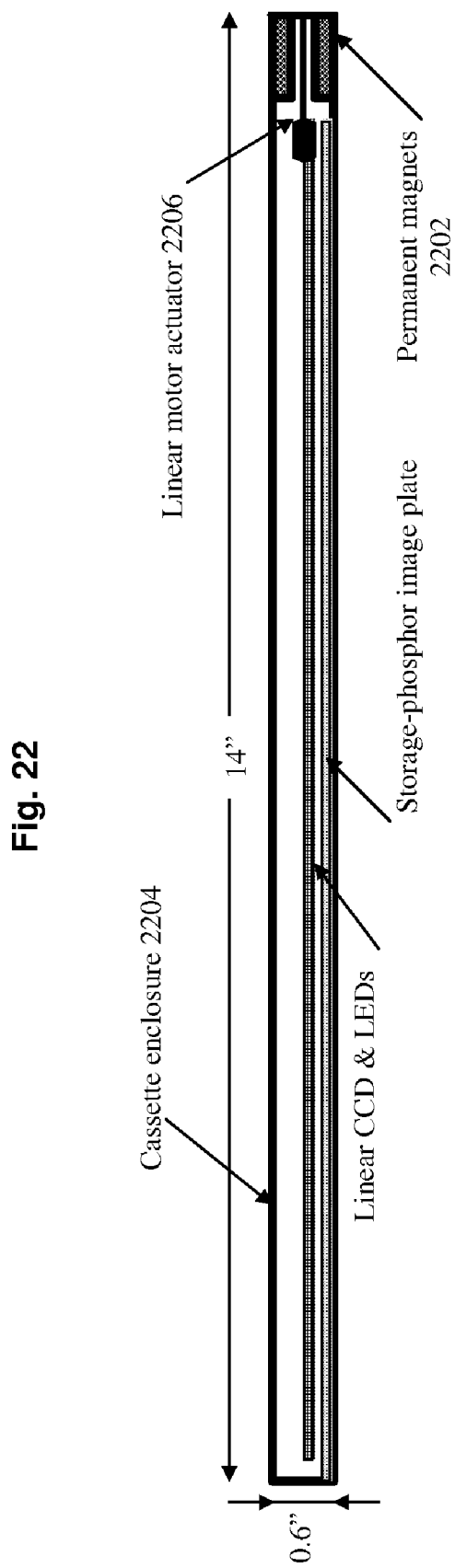

In addition, specific embodiments of the cassette of the present invention may be used in a conventional x-ray machine without modifying the x-ray beam collimation. According to such embodiments, the imaging area read by the cassette of the present invention is maintained to be very close to the imaging area of a standard film cassette employed by the x-ray machine. According to such embodiments, the blind area bordering the imaging area of the cassette is maintained to be as small as the blind area in a conventional film cassette. According to one such embodiment, this is accomplished through the use of a lead screw or belt made of radiolucent material (e.g., lead screw 1906). According to another such embodiment, the lead screw or the belt is placed at the very edge inside the cassette. For embodiments employing a magnetic linear motor (e.g., FIG. 22), a u-shaped magnet 2202 can be placed along the inside edge of the cassette 2204 and the translation stage can be fitted with a linear motor actuator 2206.

The Housing of the System

Figure 23:
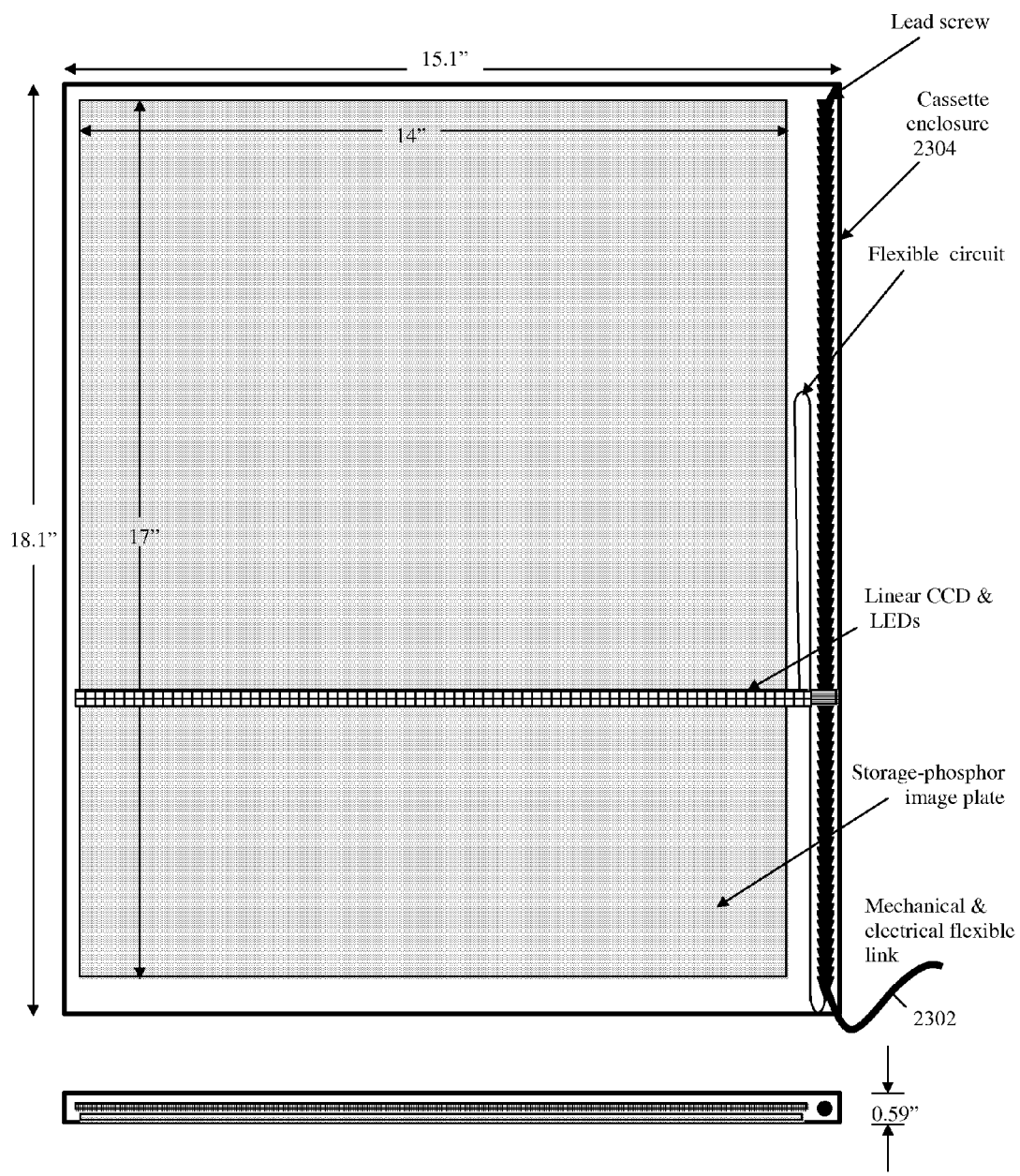
Figure 24:
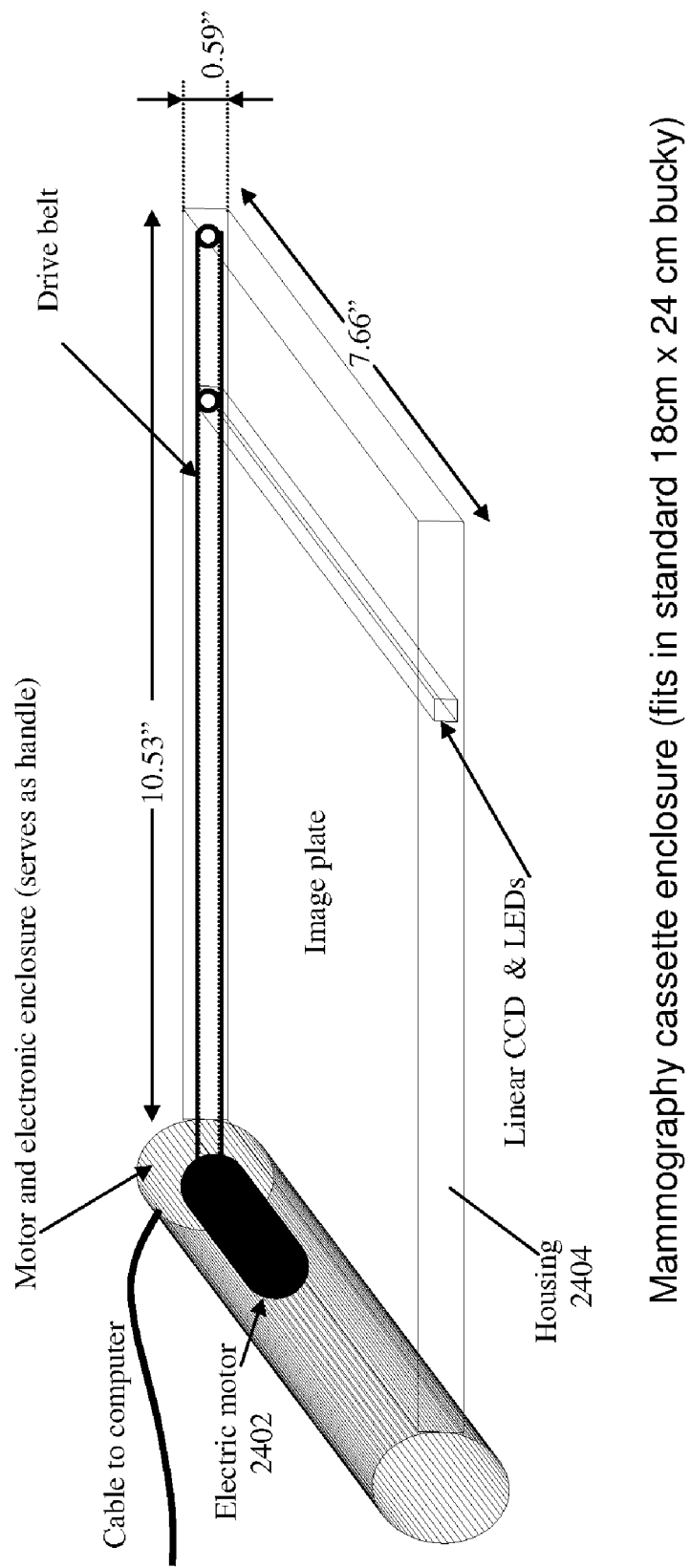

As mentioned above and according to specific embodiments, the housing of the system of the present invention is intended to be substantially identical in size to a conventional film cassette. In case of a 14"×17" cassette shown in FIG. 23, a three foot mechanical and electrical cable 2302 is provided between the cassette 2304 and the motor housing (not shown) and a longer electrical cable (not shown) is provided between the motor housing and the QA station. In the case of an 18 cm×24 cm cassette and a 24 cm×30 cm cassette shown in FIG. 24, the motor 2402 is attached to the housing 2404. In all such embodiments, the cassettes can fit in conventional buckys without any electrical or mechanical modifications.

According to another embodiment, an x-ray detection sensor is provided inside the cassette to detect whether the cassette is being exposed to x-rays. Once the x-ray exposure has stopped as indicated by the output of the x-ray detector, the start of the scanning process is triggered. This eliminates the need for a connection to and synchronization with the source of x-rays. According to a more specific embodiment, the x-ray detector is a photodiode (either a discrete component or part of the linear array) which receives the light generated by the prompt emission of the storage phosphor plate due to the exposure to the x-rays.

According to yet another embodiment, an RF detection device is provided in the cassette for detecting RF ID tags in close proximity to the cassette. This embodiment facilitates automation of the patient ID input process. Traditionally, the patient ID is entered into a workstation in the reception area and later reentered at a dedicated workstation by the x-ray technologist. The purpose of this second workstation is to "flash" each x-ray with the name and ID number of the patient as well as the date of the exam. According to the present invention, the patient is issued a wristband in the reception area which stores the patient's ID information. In this way, the patient may be automatically identified by the cassette when the wristband get close enough, the patient ID information being transmitted to or read by the associated workstation for immediate verification and inclusion with the stored image.

While the invention has been particularly shown and described with reference to specific embodiments thereof, it will be understood by those skilled in the art that changes in the form and details of the disclosed embodiments may be made without departing from the spirit or scope of the invention. For example, specific embodiments have been described herein with reference to one-dimensional, e.g., line-by-line, stimulation and readout of storage media. However, it will be understood that the principles of the present invention may be applied in the context of two-dimensional, e.g., pixel-by-pixel, stimulation and readout using, for example, a laser pencil beam rather than an array of LEDs. And although embodiments have been described herein with reference to storage-phosphor plates and digital radiography, it will be understood that the present invention is applicable to a variety of storage media and information capture technologies. For example, the techniques described herein may be used in the field of autoradiography for radio isotopic gel and blot analysis. In addition, other wavelengths of stimulating and stimulated light are contemplated. That is, for example, instead of red stimulating and blue stimulated light, the stimulating light could be infrared and the stimulated light green. Therefore, the scope of the invention should be determined with reference to the appended claims.

What is claimed is:

1. An integrated x-ray image capture and readout system, comprising:
    a cassette enclosure having a form factor corresponding to a standard radiographic film cassette, the form factor corresponding to a thickness of the cassette enclosure of about 0.6 inches;
    a storage-phosphor plate operable to capture incident x-rays corresponding to an image;
    a stimulating light source operable to expose a first portion of a surface of the storage-phosphor plate to stimulating light;
    an array of detectors positioned to receive stimulated light via a second portion of the surface of the storage-phosphor plate adjacent the first portion of the surface, the stimulated light being released from the storage-phosphor plate in response to a portion of the stimulating light diffused under the second portion of the surface of the storage-phosphor plate; and
    an actuator assembly operable to effect relative motion between the surface of the storage-phosphor plate and both the stimulating light source and the array of detectors in one dimension;
    wherein the array of detectors are positioned in sufficiently close proximity to the surface of the storage-phosphor plate such that the storage-phosphor plate, the stimulating light source, the array of detectors, and the actuator assembly are enclosed in the cassette enclosure.

2. The system of claim 1 further comprising an actuator driver positioned externally to the cassette enclosure and operationally coupled to the actuator assembly via a mechanical link.

3. The system of claim 2 wherein the actuator driver is coupled directly to the cassette enclosure.

4. The system of claim 2 wherein the actuator driver is separate from the cassette enclosure.

5. The system of claim 2 wherein the mechanical link connects the actuator driver and the actuator assembly via an aperture at a corner of the cassette enclosure.

6. The system of claim 5 wherein the mechanical link forms a 135 degree angle with each of two edges of the cassette enclosure joined at the corner.

7. The system of claim 5 wherein the mechanical link is hinged at the corner of the cassette enclosure to allow at least lateral movement of the mechanical link.

8. The system of claim 2 wherein the array of detectors is operable to convert the stimulated light to electronic data corresponding to the image, the system further comprising a transmission medium for transmitting the electronic data out of the cassette enclosure, the transmission medium exiting the cassette enclosure via the aperture.

9. The system of claim 1 wherein the actuator assembly is disposed along an edge of the cassette enclosure to maximize an imaging area of the storage-phosphor plate.

10. The system of claim 1 wherein at least a portion of the actuator assembly comprises a radiolucent material.

11. The system of claim 1 wherein the actuator assembly comprises one of a lead screw, a belt, a magnetic linear motor, and an inchworm motor.

12. The system of claim 1 wherein the array of detectors is operable to convert the stimulated light to electronic data corresponding to the image, the system further comprising a transmission medium for transmitting the electronic data out of the cassette enclosure.

13. The system of claim 1 further comprising a radio frequency detector for detecting radio frequency energy in close proximity to the cassette enclosure, the radio frequency energy corresponding to patient information to be associated with the image.

14. The system of claim 13 further comprising a radio frequency transmitter disposed outside of the cassette enclosure for generating the radio frequency energy.

15. The system of claim 14 wherein the radio frequency transmitter is included in one of a wrist band and a badge.

16. The system of claim 1 further comprising an image capture detection circuitry for sensing whether capture of the incident x-rays is occurring and generating a signal indicative thereof.

17. The system of claim 16 wherein the image capture detection circuitry comprises an x-ray detector for detecting some of the incident x-rays.

18. The system of claim 16 wherein the image capture detection circuitry comprises a photodiode for detection prompt emission of the storage-phosphor plate in response to the incident x-rays.

19. The system of claim 16 wherein the signal is employed to control actuation of the actuator assembly.

20. The system of claim 1 wherein the actuator assembly comprises a magnetic linear motor and the stimulating light source and the array of detectors are configured on a translation stage.

21. The system of claim 20 wherein the magnetic linear motor comprises at least one magnet disposed inside and along an edge of the cassette enclosure, and a linear motor actuator coupled to the translation stage.

22. The system of claim 1 wherein the form factor of the cassette enclosure corresponds to a standard radiographic film cassette having a set of dimensions corresponding to one of 14"×17", 14"×14", 10"×12", 8"×10", 35 cm×43 cm, 35 cm×35 cm, 20 cm×40 cm, 18 cm×43 cm, 13 cm×18 cm, 13 cm×30 cm, 18 cm×24 cm, or 24 cm×30 cm.

* * * * *